US012748166B2

(12) United States Patent
Yamane et al.

(10) Patent No.: US 12,748,166 B2
(45) Date of Patent: Sep. 29, 2026

(54) OPTICAL DETECTION DEVICE AND SIGNAL PROCESSING METHOD

(71) Applicant: TDK CORPORATION, Tokyo (JP)

(72) Inventors: Takekazu Yamane, Tokyo (JP); Tetsuya Shibata, Tokyo (JP); Weihao Zhang, Tokyo (JP); Hideaki Fukuzawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 363 days.

(21) Appl. No.: 18/598,761

(22) Filed: Mar. 7, 2024

(65) Prior Publication Data

US 2024/0329165 A1 Oct. 3, 2024

(30) Foreign Application Priority Data

Mar. 29, 2023 (JP) ................................ 2023-052712

(51) Int. Cl.

| | |
|---|---|
| ***G01R 33/09*** | (2006.01) |
| ***G01R 33/00*** | (2006.01) |
| ***H10N 50/10*** | (2023.01) |
| ***H10N 50/85*** | (2023.01) |

(52) U.S. Cl.

CPC ....... *G01R 33/091* (2013.01); *G01R 33/0029* (2013.01); *G01R 33/007* (2013.01); *G01R 33/093* (2013.01); *G01R 33/096* (2013.01); *H10N 50/10* (2023.02); *H10N 50/85* (2023.02); *G01R 33/098* (2013.01)

(58) Field of Classification Search

CPC ............. G01R 33/091; G01R 33/0029; G01R 33/007; G01R 33/093; G01R 33/096; G01R 33/098; H10N 50/10; H10N 50/85; G01J 1/42; G01J 1/44; G01J 2001/4446

See application file for complete search history.

(56) References Cited

U.S. PATENT DOCUMENTS

| | | | | |
|---|---|---|---|---|
| 10,763,974 | B2 * | 9/2020 | Bunandar | G02F 1/21 |
| 2001/0040713 | A1 | 11/2001 | Haruyama | |
| 2022/0131612 | A1 | 4/2022 | Fukuzawa et al. | |
| 2022/0228909 | A1 * | 7/2022 | Dietze | G01J 1/4228 |
| 2022/0416096 | A1 * | 12/2022 | Yamane | H10F 77/40 |

FOREIGN PATENT DOCUMENTS

| | | | |
|---|---|---|---|
| JP | 2001-292107 | A | 10/2001 |
| JP | 2022-069387 | A | 5/2022 |

* cited by examiner

*Primary Examiner* — Syed I Gheyas
(74) *Attorney, Agent, or Firm* — Oliff PLC

(57) ABSTRACT

This optical detection device includes a first photoelectric conversion element that outputs a first output, and a second photoelectric conversion element that outputs a second output, and is configured to combine a first signal caused by the first output with a second signal caused by the second output, in a state where a first condition and a second condition are satisfied. The first condition is a condition that an absolute value of an amount of change until the first signal reaches a peak is different from an absolute value of an amount of change until the second signal reaches a peak, and the second condition is a condition that a sign of the amount of change until the first signal reaches the peak is different from a sign of the amount of change until the second signal reaches the peak.

12 Claims, 20 Drawing Sheets

OPTICAL DETECTION DEVICE AND SIGNAL PROCESSING METHOD

FIELD OF THE INVENTION

The disclosure relates to an optical detection device and a signal processing method.

Priority is claimed on Japanese Patent Application No. 2023-052712, filed Mar. 29, 2023, the content of which is incorporated herein by reference.

BACKGROUND OF THE INVENTION

Photoelectric conversion elements are used for various purposes.

For example, Patent Document 1 describes a receiver that receives an optical signal using a photodiode. The photodiode is, for example, a pn junction diode using a pn junction of a semiconductor, and converts light into an electrical signal.

Further, for example, Patent Document 2 discloses a novel receiver, reception system, transceiver, communication system, and optical detection element that use a magnetic element. This receiver, reception system, transceiver, communication system, and optical detection element enable high-speed communication.

PRIOR ART DOCUMENT

Patent Document

[Patent Document 1] Japanese Unexamined Patent Application No. 2001-292107

[Patent Document 2] Japanese Unexamined Patent Application No. 2022-069387.

SUMMARY OF THE INVENTION

In order to realize high-speed communication, further improvement in high-speed responsiveness of a photoelectric conversion device is required. In order to improve the high-speed responsiveness of the photoelectric conversion device, when the photoelectric conversion element is irradiated with pulsed light, an output from the photoelectric conversion element needs to rise and fall rapidly. A falling time of the output from the photoelectric conversion element is often longer than a rising time, and improvement in falling characteristics of the output from the photoelectric conversion element is required.

The present invention has been made in view of the above-described problems, and an object of the present invention is to provide an optical detection device and a signal processing method in which a falling time of an output after pulsed light irradiation is short.

In order to solve the above problems, the following means are provided.

An optical detection device according to a first aspect includes a first photoelectric conversion element configured to output a first output when the first photoelectric conversion element is irradiated with a light pulse; and a second photoelectric conversion element configured to output a second output when the second photoelectric conversion element is irradiated with the light pulse, wherein the optical detection device is configured to combine a first signal caused by the first output with a second signal caused by the second output when the first photoelectric conversion element and the second photoelectric conversion element are irradiated with the same light pulse, in a state where a first condition and a second condition are satisfied. The first condition is a condition that an absolute value of an amount of change until the first signal reaches a peak is different from an absolute value of an amount of change until the second signal reaches a peak. The second condition is a condition that a sign of the amount of change until the first signal reaches the peak is different from a sign of the amount of change until the second signal reaches the peak.

A signal processing method according to a second aspect includes combining a first signal caused by a first output from a first photoelectric conversion element with a second signal caused by a second output from a second photoelectric conversion element when the first photoelectric conversion element and the second photoelectric conversion element are irradiated with the same light pulse, in a state where a first condition and a second condition are satisfied. The first condition is a condition that an absolute value of an amount of change until the first signal reaches a peak is different from an absolute value of an amount of change until the second signal reaches a peak. The second condition is a condition that a sign of the amount of change until the first signal reaches the peak is different from a sign of the amount of change until the second signal reaches the peak.

DETAILED DESCRIPTION OF THE INVENTION

Figure 1:
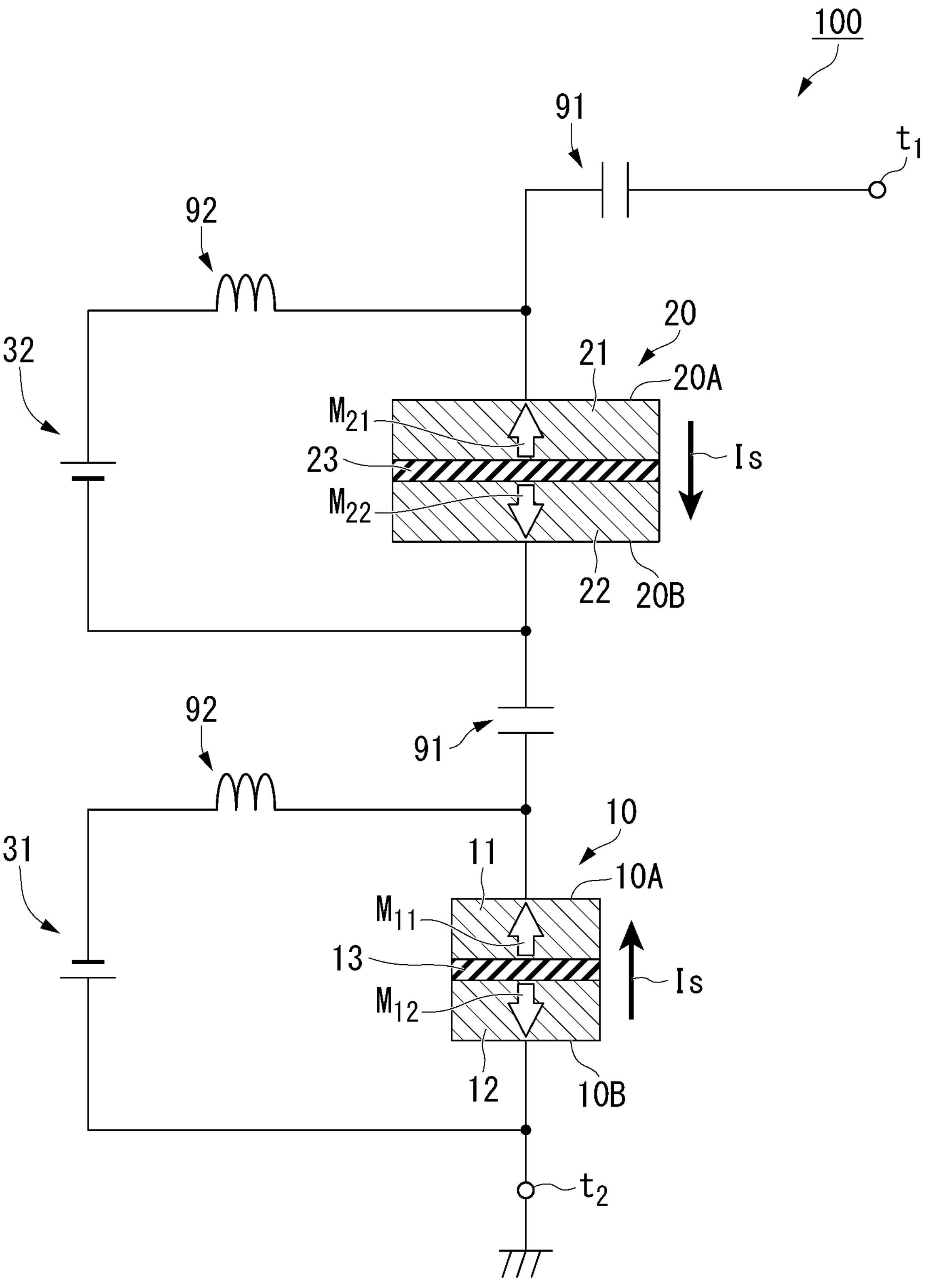
FIG. 1 is a circuit diagram of an optical detection device according to a first embodiment.

Hereinafter, embodiments will be described in detail with appropriate reference to the drawings. In the drawings used in the following description, parts that show characteristics may be shown enlarged in order to make the characteristics easier to understand, and dimensional proportions of respective components and the like may differ from those of actual dimensional proportions. The materials, dimensions, and the like shown in the following description are examples, the disclosure is not limited thereto, and the disclosure may be realized by appropriately changing the materials, the dimensions, and the like within a range in which the effects of the disclosure are achieved.

Directions will be defined. One direction in a plane in which a substrate Sub spreads is defined as an x direction, and a direction perpendicular to the x direction in the plane is defined as a y direction. Further, a direction perpendicular to the substrate Sub is defined as a z direction. The z direction is an example of a lamination direction of the first magnetic element 10 and the second magnetic element 20. Hereinafter, a +z direction may be expressed as "up" and a −z direction as "down." The +z direction is a direction from a second ferromagnetic layer to a first ferromagnetic layer. Up and down do not necessarily match a direction in which gravity is applied.

"First embodiment" FIG. 1 is a circuit diagram of an optical detection device 100 according to a first embodiment. In FIG. 1, directions of magnetization of a ferromagnetic material in a state where the optical detection device 100 is not irradiated with light are indicated by arrows.

The optical detection device 100 includes, for example, a first magnetic element 10, a second magnetic element 20, capacitors 91, inductors 92, an output terminal $t_1$, and a reference potential terminal $t_2$. The optical detection device 100 may include a power supply 31 and a power supply 32, and the power supply 31 and the power supply 32 may be external to the optical detection device 100. The first magnetic element 10 is an example of a first photoelectric conversion element, and the second magnetic element 20 is an example of a second photoelectric conversion element. The first photoelectric conversion element (the first magnetic element 10) outputs a first output when the first photoelectric conversion element is irradiated with a light pulse, and the second photoelectric conversion element (the second magnetic element 20) outputs a second output when the second photoelectric conversion element is irradiated with a light pulse. The first magnetic element 10 and the second magnetic element 20 may be replaced with known photoelectric conversion elements such as pn junction type photodiodes. In this case, a cathode of a semiconductor photodiode corresponding to the first photoelectric conversion element is connected to a positive terminal of the power supply 31, an anode thereof is connected to a negative terminal of the power supply 31, a cathode of a semiconductor photodiode corresponding to the second photoelectric conversion element is connected to a positive terminal of the power supply 32, and an anode thereof is connected to a negative terminal of the power supply 32. The first magnetic element 10, the second magnetic element 20, the power supply 31, the power supply 32, the capacitors 91, the inductors 92, the output terminal $t_1$, and the reference potential terminal $t_2$ are connected by a line.

The output terminal $t_1$ is a terminal to which a signal from the optical detection device 100 is output. The optical detection device 100 outputs, for example, a combined resistance, a combined potential, and the like of the first magnetic element 10 and the second magnetic element 20 from the output terminal $t_1$.

The reference potential terminal $t_2$ is connected to a reference potential and determines a reference potential of the optical detection device 100. The reference potential terminal $t_2$ is connected to the first magnetic element 10, for example. The reference potential illustrated in FIG. 1 is ground. The ground may be provided outside the optical detection device 100. The reference potential may be something other than ground.

The power supply 31 is a DC power supply and is connected to the first magnetic element 10. A known power supply can be used as the power supply 31.

The power supply 31 may be, for example, a direct current source capable of generating a constant direct current. The power supply 31 may be a direct current source in which a magnitude of a generated direct current value can vary. When the first photoelectric conversion element and the second photoelectric conversion element are pn junction type photodiodes, the power supply 31, and the power supply 32 to be described later may be DC voltage sources capable of applying a constant DC voltage. The power supply 31 applies a direct current or a direct current to the first magnetic element 10. The optical detection device 100 is configured, for example, so that a first surface 10A of the first magnetic element 10 on the output terminal $t_1$ side is connected to the negative terminal of the power supply 31, and a second surface 10B facing the first surface 10A of the first magnetic element 10 is connected to the positive terminal of the power supply 31.

The power supply 32 is a DC power supply and is connected to the second magnetic element 20. The power supply 32 can be the same as the power supply 31. The power supply 32 applies a DC current or DC voltage to the second magnetic element 20. The optical detection device 100 is configured, for example, such that a first surface 20A of the second magnetic element 20 on the output terminal $t_1$ side is connected to the positive terminal of the power supply 32, and a second surface 20B facing the first surface 20A of the second magnetic element 20 is connected to the negative terminal of power supply 32.

The optical detection device 100 is configured such that a polarity (sign) of the power supply 31 to be connected to the first surface 10A of the first magnetic element 10 on the output terminal $t_1$ side is different from a polarity (sign) of the power supply 32 to be connected to the first surface 20A of the second magnetic element 20 on the output terminal $t_1$ side. Here, although an example in which the first surface 10A is connected to the negative terminal of the power supply 31, the second surface 10B is connected to the positive terminal of the power supply 31, the first surface 20A is connected to the positive terminal of the power supply 32, and the second surface 20B is connected to the negative terminal of the power supply 32 has been shown, the first surface 10A may be connected to the positive terminal of the power supply 31, the second surface 10B may be connected to the negative terminal of the power supply 31, the first surface 20A may be connected to the negative terminal of the power supply 32, and the second surface 20B may be connected to the positive terminal of the power supply 32.

The inductor 92 is located, for example, between the power supply 31 and the first magnetic element 10 and between the power supply 32 and the second magnetic element 20. As the inductor 92, for example, a chip inductor, an inductor using a patterned line, a resistance element having an inductor component, or the like can be used.

The capacitor 91 is, for example, between the first magnetic element 10 and the output terminal $t_1$ and between the second magnetic element 20 and the output terminal $t_1$. A known capacitor can be used for the capacitor 91. The capacitor 91 passes only high frequency components of change in output voltages of the first magnetic element 10 and the second magnetic element 20 toward the output terminal $t_1$.

Figure 2:
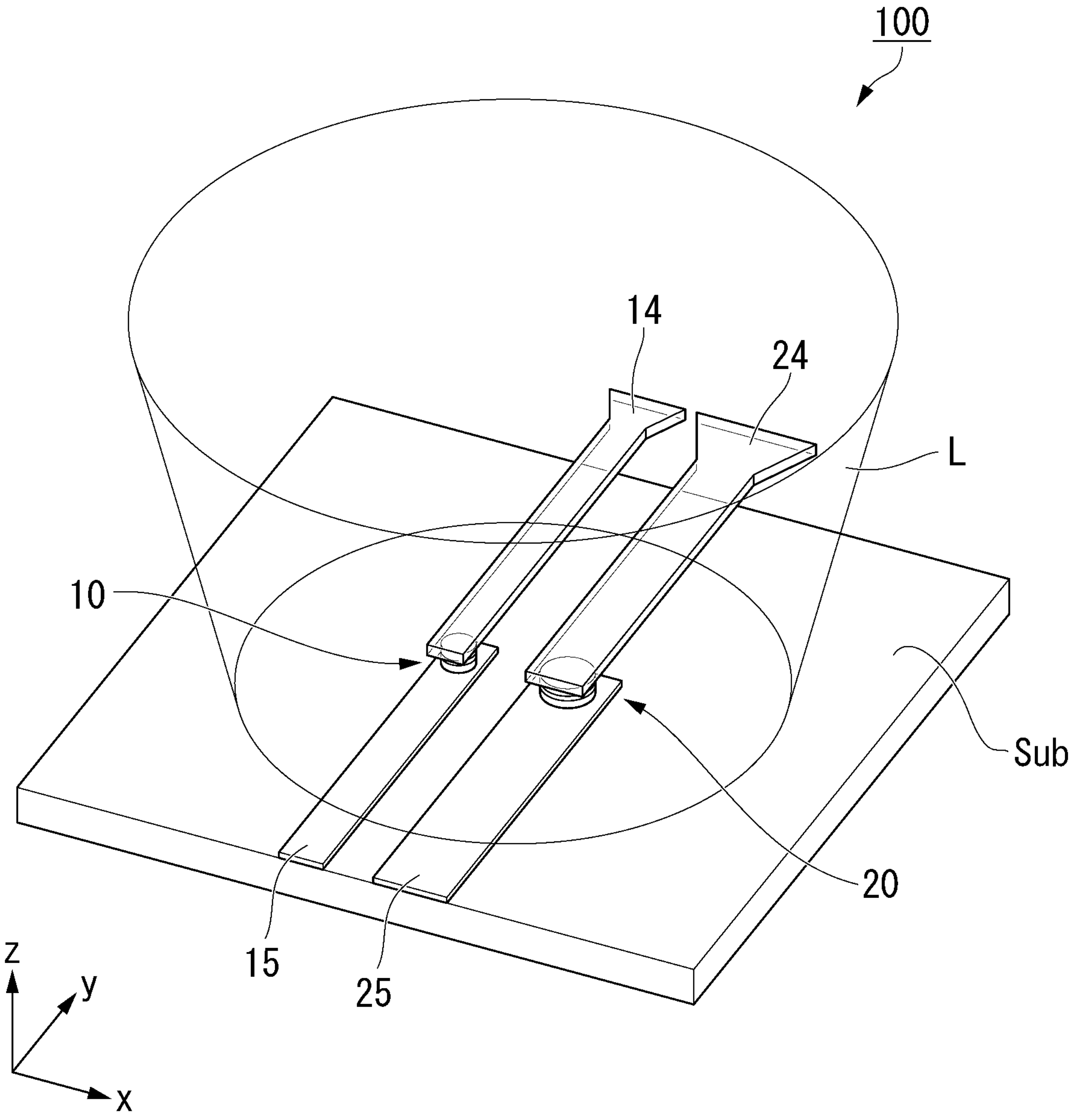
FIG. 2 is a perspective view of the vicinity of a first magnetic element and a second magnetic element of the optical detection device according to the first embodiment.

FIG. 2 is a perspective view of the vicinity of the first magnetic element 10 and the second magnetic element 20 of the optical detection device 100 according to the first embodiment.

The optical detection device 100 replaces the light L irradiated to the optical detection device 100 with an electrical signal. The first magnetic element 10 and the second magnetic element 20 are irradiated with the light L.

The light L is not limited to visible light, but also includes infrared rays having a longer wavelength than visible light, or ultraviolet rays having a shorter wavelength than visible light. The wavelength of the visible light is, for example, 380 nm or more and less than 800 nm. The wavelength of the infrared rays is, for example, 800 nm or more and 1 mm or less. The wavelength of the ultraviolet rays is, for example, 200 nm or more and less than 380 nm. The first magnetic element 10 and the second magnetic element 20 are irradiated with the light L, for example, as a light pulse. The light L includes, for example, a high frequency optical signal including a plurality of light pulses that are repeated at a high frequency. The high frequency optical signal is, for example, a signal having a frequency of 100 MHz or more. The light L may be a laser beam.

The first magnetic element 10 is connected to a first electrode 14 and a second electrode 15. The first electrode 14 is in contact with a light L irradiation surface of the first magnetic element 10. The second electrode 15 is in contact with a surface that faces the light irradiation surface of the first magnetic element 10. The first electrode 14 and the second electrode 15 sandwich the first magnetic element 10 in the z direction.

The first electrode 14 is made of a conductive material. The first electrode 14 is, for example, a transparent electrode that is transparent to light in a used wavelength band. It is preferable for the first electrode 14 to transmit, for example, 80% or more of the light in the used wavelength band. The first electrode 14 is, for example, an oxide such as indium tin oxide (ITO), indium zinc oxide (IZO), zinc oxide (ZnO), or indium gallium zinc oxide (IGZO). The first electrode 14 may be configured to have a structure in which a plurality of columnar metals are included in a transparent electrode material of these oxides. It is not essential to use the transparent electrode material as described above as the first electrode 14, and a metal material such as Au, Cu or Al is used with a small film thickness so that the irradiation light L can reach the first ferromagnetic layer 11 of the first magnetic element 10. When a metal is used as a material of the first electrode 14, a film thickness of the first electrode 14 is, for example, 3 to 10 nm. Further, the first electrode 14 may have an antireflection film on the irradiation surface that is irradiated with light.

The second electrode 15 is on the opposite side of the first electrode 14 with the first magnetic element 10 interposed therebetween. The second electrode 15 is made of a conductive material. The second electrode 15 is made of, for example, a metal such as Cu, Al, or Au. Ta or Ti may be stacked above and below these metals. Further, a stacked film of Cu and Ta, a stacked film of Ta, Cu, and Ti, or a stacked film of Ta, Cu, and TaN may be used. Further, as the second electrode 15, TiN or TaN may be used. A film thickness of the second electrode 15 is, for example, 200 nm to 800 nm.

The second electrode 15 may be transparent to the light L with which the first magnetic element 10 is irradiated. As a material of the second electrode 15, for example, a transparent electrode material of an oxide such as indium tin oxide (ITO), indium zinc oxide (IZO), zinc oxide (ZnO), or indium gallium zinc oxide (IGZO) may also be used, similar to the first electrode 14. Even when light is radiated from the first electrode 14, the light may reach the second electrode 15 depending on the intensity of the light, but in this case, the second electrode 15 is configured to include the transparent electrode material of the oxide, thereby curbing reflection of light at an interface between the second electrode 15 and a layer that is in contact with the second electrode 15, as compared to a case where the second electrode 15 is made of a metal.

The second magnetic element 20 is connected to the first electrode 24 and the second electrode 25. The first electrode 24 is in contact with a light L irradiation surface of the second magnetic element 20. The second electrode 25 is in contact with a surface that faces the light irradiation surface of the second magnetic element 20. The first electrode 24 and the second electrode 25 sandwich the second magnetic element 20 in the z direction. The first electrode 24 can be made of the same material as the first electrode 14, and the second electrode 25 can be made of the same material as the second electrode 15.

Figure 3:
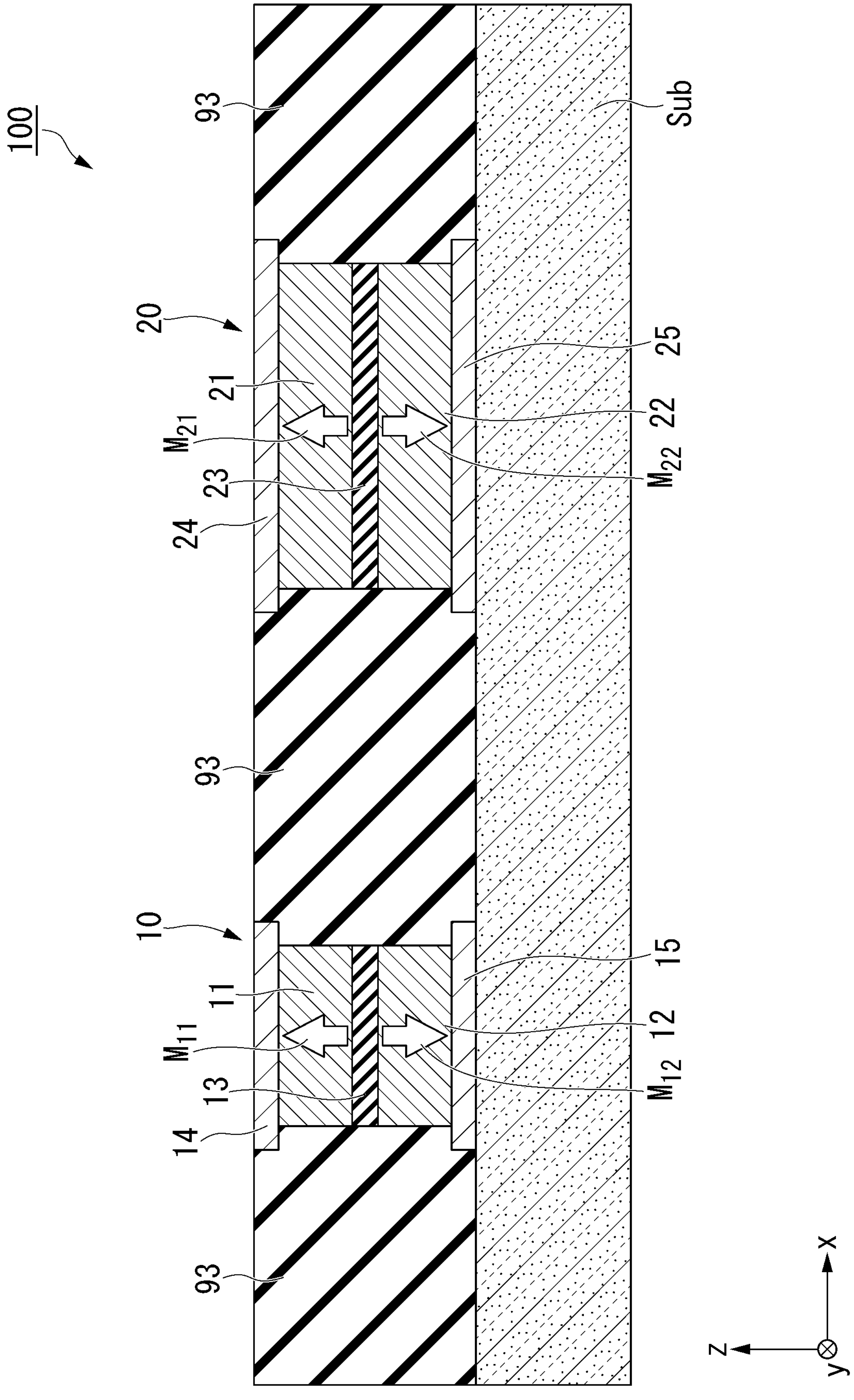
FIG. 3 is a cross-sectional view of the vicinity of the first magnetic element and the second magnetic element according to the first embodiment.

FIG. 3 is a cross-sectional view of the vicinity of the first magnetic element 10 and the second magnetic element 20 according to the first embodiment. In FIG. 3, directions of magnetization of a ferromagnetic material in a state where the optical detection device 100 is not irradiated with light are indicated by arrows.

Surroundings of the first magnetic element 10 and the second magnetic element 20 are covered with an insulating layer 93, for example. The insulating layer 93 is, for example, an oxide, nitride, or oxynitride of Si, Al, or Mg. The insulating layer 93 is made of, for example, silicon oxide ($SiO_x$), silicon nitride ($SiN_x$), silicon carbide (SiC), chromium nitride (CrN), silicon carbonitride (SiCN), silicon oxynitride (SiON), aluminum oxide ($Al_2O_3$), zirconium oxide ($ZrO_x$), or the like.

The first magnetic element 10 includes, for example, a first ferromagnetic layer 11, a second ferromagnetic layer 12, and a spacer layer 13. The spacer layer 13 is located between the first ferromagnetic layer 11 and the second ferromagnetic layer 12. The first magnetic element 10 may have other layers in addition to these. The first magnetic element 10 is irradiated with the light L from the first ferromagnetic layer 11 side. The first ferromagnetic layer 11 is closer to the first electrode 14 than the second ferromagnetic layer 12. The second ferromagnetic layer 12 is closer to the second electrode 15 than the first ferromagnetic layer 11.

The second magnetic element 20 includes, for example, a first ferromagnetic layer 21, a second ferromagnetic layer 22, and a spacer layer 23. The spacer layer 23 is located between the first ferromagnetic layer 21 and the second ferromagnetic layer 22.

The second magnetic element 20 may have other layers in addition to these. The second magnetic element 20 is irradiated with the light L from the first ferromagnetic layer 21 side. The first ferromagnetic layer 21 is closer to the first electrode 24 than the second ferromagnetic layer 22. The second ferromagnetic layer 22 is closer to the second electrode 25 than the first ferromagnetic layer 21.

An area of the first ferromagnetic layer 11 of the first magnetic element 10 when viewed from the z direction is different from an area of the first ferromagnetic layer 21 of the second magnetic element 20 when viewed from the z direction. Each of the first magnetic element 10 and the second magnetic element 20 is a columnar body. The first magnetic element 10 and the second magnetic element 20 may be square prisms, cylinders, or triangular prisms. If areas of the first ferromagnetic layer 11 and the first ferromagnetic layer 21 when viewed from the z direction are different from each other, a time required for falling of the first output from the first magnetic element 10 is different from a time required for falling of the second output from the second magnetic element 20. If an area of the first ferromagnetic layer when viewed from the z direction is small, a falling time until an output from the magnetic element returns to an original state after irradiation with a light pulse is short.

In the first magnetic element 10 illustrated in FIG. 3, the magnetization $M_{11}$ of the first ferromagnetic layer 11 and the magnetization $M_{12}$ of the second ferromagnetic layer 12 are in an antiparallel relationship in a state where the first magnetic element 10 is not irradiated with light. In the second magnetic element 20 illustrated in FIG. 3, the magnetization $M_{21}$ of the first ferromagnetic layer 21 and the magnetization $M_{22}$ of the second ferromagnetic layer 22 are in an antiparallel relationship in a state where the second magnetic element 20 is not irradiated with light. In the first embodiment, a relationship between magnetization directions of the first ferromagnetic layer 11 and the second ferromagnetic layer 12 of the first magnetic element 10 is the same as a relationship between the magnetization directions of the first ferromagnetic layer 21 and the second ferromagnetic layer 22 of the second magnetic element 20 in a state where the first magnetic element 10 and the second magnetic element 20 are not irradiated with light. Here, although an example in which a relationship between the magnetization directions of the first ferromagnetic layer 11 and the second ferromagnetic layer 12 of the first magnetic element 10 and the relationship between the magnetization directions of the first ferromagnetic layer 21 and the second ferromagnetic layer 22 of the second magnetic element 20 are both antiparallel in a state where the first magnetic element 10 and the second magnetic element 20 are not irradiated with light has been illustrated, the relationships between the magnetization directions may be parallel, or for example, the relationships between the magnetization directions may be in relationships other than the parallel or antiparallel relationship, as in a state where the direction of magnetization $M_{11}$ of the first ferromagnetic layer 11 or the magnetization $M_{21}$ of the first ferromagnetic layer 21 is inclined with respect to the lamination direction and the in-plane direction.

The first magnetic element 10 and the second magnetic element 20 are, for example, magnetic tunnel junction (MTJ) elements in which the spacer layers 13 and 23 are made of an insulating material. The first magnetic element 10 is, for example, an element whose resistance value in the z direction (a resistance value when a current flows in the z direction) changes according to relative change between the magnetization state of the first ferromagnetic layer 11 and the magnetization state of the second ferromagnetic layer 12. Such an element is also called a magnetoresistive effect element. Similarly, the second magnetic element 20 also is, for example, an element whose resistance value in the z direction (a resistance value when a current flows in the z direction) changes according to relative change between the magnetization state of the first ferromagnetic layer 21 and the magnetization state of the second ferromagnetic layer 22.

In the first magnetic element 10, when the intensity of the light L with which the first magnetic element 10 is irradiated changes, a voltage output from the first magnetic element 10 (a potential difference between the first electrode 14 and the second electrode 15) changes depending on the change in the intensity of the light L. The first magnetic element 10 outputs the first output when first magnetic element 10 is irradiated with a light pulse. An amount of change in the voltage of the first output (an amount of change with the output voltage from the first magnetic element 10 in a state where the first magnetic element 10 is not irradiated with the light pulse as a reference) is output from the output terminal $t_1$. For example, the change in the voltage of the first output is output from the output terminal $t_1$ as a first signal caused by the first output.

In the second magnetic element 20, when the intensity of the light L with which the second magnetic element 20 is irradiated changes, a voltage output from the second magnetic element 20 (a potential difference between the first electrode 24 and the second electrode 25) changes depending on the change in the intensity of the light L. The second magnetic element 20 outputs the second output when the second magnetic element 20 is irradiated with a light pulse. An amount of change in the voltage of the second output (an amount of change with an output voltage from the second magnetic element 20 in a state where the light pulse is not irradiated as a reference) is output from the output terminal $t_1$. For example, the change in the voltage of the second output is output from the output terminal $t_1$ as a second signal caused by the second output.

The first ferromagnetic layer 11 is an optical detection layer whose magnetization state changes when the optical detection layer is irradiated with light from the outside. The first ferromagnetic layer 11 is also called a magnetization free layer. The magnetization free layer is a layer containing a magnetic material whose magnetization state changes when a predetermined external energy is applied. The predetermined external energy is, for example, light L radiated from the outside, a current flowing in the z direction of the first ferromagnetic layer 11, or an external magnetic field. The state of the magnetization of the first ferromagnetic layer 11 changes depending on the intensity of the light L with which the first ferromagnetic layer 11 is irradiated.

The first ferromagnetic layer 11 contains a ferromagnetic material. The first ferromagnetic layer 11 contains, for example, at least one of a magnetic element such as Co, Fe, or Ni. The first ferromagnetic layer 11 may contain nonmagnetic elements such as B, Mg, Hf, and Gd, in addition to the above-described magnetic elements. The first ferromagnetic layer 11 may be, for example, an alloy containing a magnetic element and a nonmagnetic element. The first ferromagnetic layer 11 may include a plurality of layers. The first ferromagnetic layer 11 is, for example, a CoFeB alloy, a stack in which the CoFeB alloy layer is sandwiched between Fe layers, or a stack in which a CoFeB alloy layer is sandwiched between CoFe layers. Generally, "ferromagnetism" includes "ferrimagnetism." The first ferromagnetic layer 11 may show the ferrimagnetism. On the other hand, the first ferromagnetic layer 11 may show ferromagnetism other than ferrimagnetism. For example, the CoFeB alloy exhibits ferromagnetism but not ferrimagnetism.

The first ferromagnetic layer 11 may be an in-film-surface magnetization film having a magnetization ease axis in an in-plane direction (any direction in an xy plane) or may be a perpendicular magnetization film having a magnetization ease axis in a direction perpendicular to a film surface (the z direction).

A film thickness of the first ferromagnetic layer 11 is, for example, 1 nm or more and 5 nm or less. The film thickness of the first ferromagnetic layer 11 is preferably, for example, 1 nm or more and 2 nm or less. When the first ferromagnetic layer 11 is a perpendicular magnetization film, if the film thickness of the first ferromagnetic layer 11 is small, an effect of applying perpendicular magnetic anisotropy from layers above and below the first ferromagnetic layer 11 becomes stronger and the perpendicular magnetic anisotropy of the first ferromagnetic layer 11 increases. That is, when the perpendicular magnetic anisotropy of the first ferromagnetic layer 11 is high, a force that tends to cause the magnetization to return to the z direction becomes stronger. On the other hand, when the film thickness of the first ferromagnetic layer 11 is large, the effect of applying the perpendicular magnetic anisotropy from the layers above and below the first ferromagnetic layer 11 is relatively weakened, and the perpendicular magnetic anisotropy of the first ferromagnetic layer 11 is weakened.

When the film thickness of the first ferromagnetic layer 11 becomes smaller, a volume of a ferromagnetic material becomes smaller, and the film thickness of the first ferromagnetic layer 11 becomes larger, the volume of the ferromagnetic material becomes larger. Ease of reaction of the magnetization of the first ferromagnetic layer 11 when external energy is applied is inversely proportional to a product KuV of the magnetic anisotropy Ku and the volume V of the first ferromagnetic layer 11. That is, when the product of the magnetic anisotropy and the volume of the first ferromagnetic layer 11 becomes smaller, the reactivity to light increases. From this point of view, in order to enhance the response to light, it is preferable to appropriately design the magnetic anisotropy of the first ferromagnetic layer 11 and then reduce the volume of the first ferromagnetic layer 11.

When the film thickness of the first ferromagnetic layer 11 is larger than 2 nm, an insertion layer made of, for example, Mo or W may be provided within the first ferromagnetic layer 11. That is, the first ferromagnetic layer 11 may be a stack in which a ferromagnetic layer, an insertion layer, and a ferromagnetic layer are sequentially stacked in the z direction. The perpendicular magnetic anisotropy of the entire first ferromagnetic layer 11 increases due to an interfacial magnetic anisotropy at an interface between the insertion layer and the ferromagnetic layer. A film thickness of the insertion layer is, for example, 0.1 nm to 0.6 nm.

The second ferromagnetic layer 12 is a magnetization fixed layer. The magnetization fixed layer is a layer made of a magnetic material of which change in a magnetization state is more difficult than that of the magnetization free layer when predetermined external energy is applied. For example, it is more difficult for a direction of magnetization of the magnetization fixed layer to change than that of the magnetization free layer when the predetermined external energy is applied. Further, for example, it is more difficult for a magnitude of the magnetization of the magnetization fixed layer to change than that of the magnetization free layer when the predetermined external energy is applied. The coercive force of the second ferromagnetic layer 12 is larger than the coercive force of the first ferromagnetic layer 11, for example. The second ferromagnetic layer 12 has a magnetization ease axis in the same direction as in the first ferromagnetic layer 11, for example. The second ferromagnetic layer 12 may be an in-film-surface magnetization film or a perpendicular magnetization film.

The material constituting the second ferromagnetic layer 12 is, for example, the same as that of the first ferromagnetic layer 11. The second ferromagnetic layer 12 is, for example, a stack in which Co having a thickness of 0.4 nm to 1.0 nm, Mo having a thickness of 0.1 nm to 0.5 nm, a CoFeB alloy having a thickness of 0.3 nm to 1.0 nm, and Fe having a thickness of 0.3 nm to 1.0 nm are sequentially stacked.

The magnetization of the second ferromagnetic layer 12 may be fixed, for example, by magnetic coupling with the third ferromagnetic layer via a magnetic coupling layer. In this case, a combination of the second ferromagnetic layer 12, the magnetic coupling layer, and the third ferromagnetic layer may be referred to as the magnetization fixed layer.

The third ferromagnetic layer is magnetically coupled to the second ferromagnetic layer 12, for example. The magnetic coupling is, for example, antiferromagnetic coupling and is caused by RKKY interaction. A material constituting the third ferromagnetic layer is, for example, the same as that of the first ferromagnetic layer 11. The magnetic coupling layer is made of, for example, Ru or Ir.

The spacer layer 13 is a nonmagnetic layer disposed between the first ferromagnetic layer 11 and the second ferromagnetic layer 12. The spacer layer 13 is configured as a layer made of a conductor, an insulator, or a semiconductor, or a layer including a current-carrying point made of a conductor in an insulator. The film thickness of the spacer layer 13 can be adjusted depending on an orientation direction of the magnetization of the first ferromagnetic layer 11 and the magnetization of the second ferromagnetic layer 12 in an initial state, which will be described later.

For example, when the spacer layer 13 is made of an insulator, the first magnetic element 10 has a magnetic tunnel junction (MTJ) made of the first ferromagnetic layer 11, the spacer layer 13, and the second ferromagnetic layer 12. Such an element is called an MTJ element. In this case, the first magnetic element 10 can exhibit a tunnel magnetoresistance (TMR) effect. For example, when the spacer layer 13 is made of metal, the first magnetic element 10 can exhibit a giant magnetoresistance (GMR) effect. Such an element is called a GMR element.

When the spacer layer 13 is made of an insulating material, a material containing aluminum oxide, magnesium oxide, titanium oxide, silicon oxide, or the like can be used. Further, these insulating materials may contain elements such as Al, B, Si, and Mg, or magnetic elements such as Co, Fe, and Ni. The film thickness of the spacer layer 13 is adjusted so that a high TMR effect is exhibited between the first ferromagnetic layer 11 and the second ferromagnetic layer 12, thereby obtaining a high magnetoresistive change rate. In order to use the TMR effect efficiently, the film thickness of the spacer layer 13 may be about 0.5 to 5.0 nm or may be about 1.0 to 2.5 nm.

When the spacer layer 13 is made of a nonmagnetic conductive material, a conductive material such as Cu, Ag, Au, or Ru can be used. The film thickness of the spacer layer 13 may be about 0.5 to 5.0 nm, or approximately 2.0 to 3.0 nm in order to use the GMR effect efficiently.

When the spacer layer 13 is made of a nonmagnetic semiconductor material, a material such as zinc oxide, indium oxide, tin oxide, germanium oxide, gallium oxide, or ITO can be used. In this case, the film thickness of the spacer layer 13 may be about 1.0 to 4.0 nm.

When a layer including a current-carrying point made of a conductor in a nonmagnetic insulator is applied as the spacer layer 13, a structure in which the current-carrying point formed of a nonmagnetic conductor such as Cu, Au, or Al is included in a nonmagnetic insulator made of aluminum oxide or magnesium oxide is obtained. Further, the conductor may be made of a magnetic element such as Co, Fe, or Ni. In this case, the film thickness of the spacer layer 13 may be about 1.0 to 2.5 nm. The current-carrying point is, for example, a columnar body having a diameter of 1 nm or more and 5 nm or less when viewed from a direction perpendicular to the film surface. As described above, the first magnetic element 10 may be differently called a MTJ element, a GMR element, and the like depending on a constituent material of the spacer layer 13, but is also collectively called a magnetoresistive effect element.

In addition, the first magnetic element 10 may have an underlayer, a cap layer, a perpendicular magnetization inducing layer, or the like. The underlayer is below the second ferromagnetic layer 12. The underlayer is a seed layer or a buffer layer. The seed layer increases the crystallinity of a layer stacked on the seed layer. The seed layer is, for example, Pt, Ru, Hf, Zr, NiFeCr. A film thickness of the seed layer is, for example, 1 nm or more and 5 nm or less. The buffer layer is a layer that alleviates lattice mismatch between different crystals. The buffer layer is, for example, Ta, Ti, W, Zr, Hf, or a nitride of these elements. A film thickness of the buffer layer is, for example, 1 nm or more and 5 nm or less.

The cap layer is above the first ferromagnetic layer 11. The cap layer prevents an underlying layer from being damaged in a processing process and increases the crystallinity of the underlying layer at the time of annealing. A film thickness of the cap layer is, for example, 3 nm or less so that the first ferromagnetic layer 11 is irradiated with sufficient light. The cap layer is, for example, MgO, W, Mo, Ru, Ta, Cu, Cr, or a stacked film thereof.

The perpendicular magnetization inducing layer is formed when the first ferromagnetic layer 11 is a perpendicular magnetization film. The perpendicular magnetization inducing layer is stacked on the first ferromagnetic layer 11. The perpendicular magnetization inducing layer induces perpendicular magnetic anisotropy in the first ferromagnetic layer 11. The perpendicular magnetization inducing layer is made of, for example, magnesium oxide, W, Ta, Mo, or the like. When the perpendicular magnetization inducing layer is made of magnesium oxide, it is preferable for the magnesium oxide to be deficient in oxygen in order to improve conductivity. A film thickness of the perpendicular magnetization inducing layer is, for example, 0.5 nm or more and 2.0 nm or less.

The first ferromagnetic layer 21 in the second magnetic element 20 corresponds to the first ferromagnetic layer 11 in the first magnetic element 10. The constituent material, film thickness, layer structure, and the like of the first ferromagnetic layer 21 can be the same as those of the first ferromagnetic layer 11. The second ferromagnetic layer 22 in the second magnetic element 20 corresponds to the second ferromagnetic layer 12 in the first magnetic element 10. The constituent material, film thickness, layer structure, and the like of the second ferromagnetic layer 22 can be the same as those of the second ferromagnetic layer 12. The spacer layer 23 in the second magnetic element 20 corresponds to the spacer layer 13 in the first magnetic element 10. The constituent material, film thickness, layer structure, and the like of the spacer layer 23 can be the same as those of the spacer layer 13. Further, the second magnetic element 20 may include an underlayer, a cap layer, a perpendicular magnetization inducing layer, and the like, like the first magnetic element 10.

The first magnetic element 10 and the second magnetic element 20 are manufactured by, for example, a lamination process, an annealing process, and a processing process of each layer. Each layer is formed by sputtering, for example. Annealing is performed, for example, at a temperature of 250° C. or more and 450° C. or less. The processing of the stacked film is performed using, for example, photolithography and etching. A shortest width of the first magnetic element 10 and the second magnetic element 20 when viewed from the z direction may be, for example, 10 nm or more and 2000 nm or less, or may be 30 nm or more and 500 nm or less.

Although an example of the first magnetic element 10 and the second magnetic element 20 is illustrated in FIG. 3, the magnetic elements may have a ferromagnetic material whose state of magnetization changes due to irradiation with light, and the resistance value may change with the change in the state of magnetization. For example, an anisotronic magnetoresistance (AMR) effect element, a colossal magnetoresistance (CMR) effect element, or the like, in addition to the MTJ element and the GMR element described above, can be used for the magnetic element.

Next, an operation of the optical detection device 100 will be described. When the first magnetic element 10 is irradiated with a light pulse, the first magnetic element 10 outputs the first output. Change in the voltage of the first output (voltage change with the output voltage from the first magnetic element 10 in a state where the first magnetic element 10 is not irradiated with the light pulse as a reference) is output from the output terminal $t_1$. The change in voltage of the first output is an example of the first signal, as described above. Similarly, when the second magnetic element 20 is irradiated with a light pulse, the second magnetic element 20 outputs the second output. The change in the voltage of the second output (voltage change with the output voltage from the second magnetic element 20 in a state where the second magnetic element 20 is not irradiated with the light pulse as a reference) is output from the output terminal $t_1$. The change in the voltage of the second output is an example of the second signal, as described above. That is, when the first magnetic element 10 and the second magnetic element 20 are irradiated with the same light pulse, a voltage that is a sum of the change (first signal) in the voltage of the first output and the change (second signal) in the voltage of the second output are output from the output terminal $t_1$.

The optical detection device 100 combines the first signal with the second signal according to a predetermined signal processing method and outputs a combination signal from the output terminal $t_1$. The optical detection device 100 combines the first signal caused by the first output with the second signal caused by the second output when the first magnetic element 10 and the second magnetic element 20 are irradiated with the same light pulse, in a state where the first condition and the second condition are satisfied. The first signal is caused by the first output, and may be, for example, a signal obtained by extracting change in the voltage of the first output, may be the first output itself, may be a signal obtained by extracting change in the voltage of the first output and inverting a polarity, or may be a signal obtained by changing an intensity of the first output. The second signal is caused by the second output, and may be, for example, a signal obtained by extracting the change in the voltage of the second output, may be the second output itself, may be a signal obtained by extracting change in the voltage of the second output and inverting a polarity, or may be a signal obtained by changing the intensity of the second output.

In the example illustrated in FIG. 1, the optical detection device 100 outputs, from the output terminal $t_1$, a voltage that is a sum (combination) of the change (first signal) in the voltage of the first output and (with) the change (second signal) in voltage of the second output when the first magnetic element 10 and the second magnetic element 20 are irradiated with the same light pulse. The first condition is a condition that an absolute value of the amount of change to the peak in the first signal is different from the absolute value of the amount of change to the peak in the second signal. The second condition is a condition that a sign of the amount of change to the peak in the first signal is different from a sign of the amount of change to the peak in the second signal.

First, a principle in which the first output is output from the first magnetic element 10 when the first magnetic element 10 is irradiated with a light pulse, and a principle in which the second output is output from the second magnetic element 20 when the second magnetic element 20 is irradiated with a light pulse will be described. Since principles of operations of the first magnetic element 10 and the second magnetic element 20 are the same, the operation of the first magnetic element 10 will be described hereinafter as an example.

The first ferromagnetic layer 11 is irradiated with a light pulse. The resistance value of the first magnetic element 10 in the z direction changes as the first ferromagnetic layer 11 is irradiated with light. The output voltage from the first magnetic element 10 changes as the first ferromagnetic layer 11 is irradiated with light.

Figure 4:
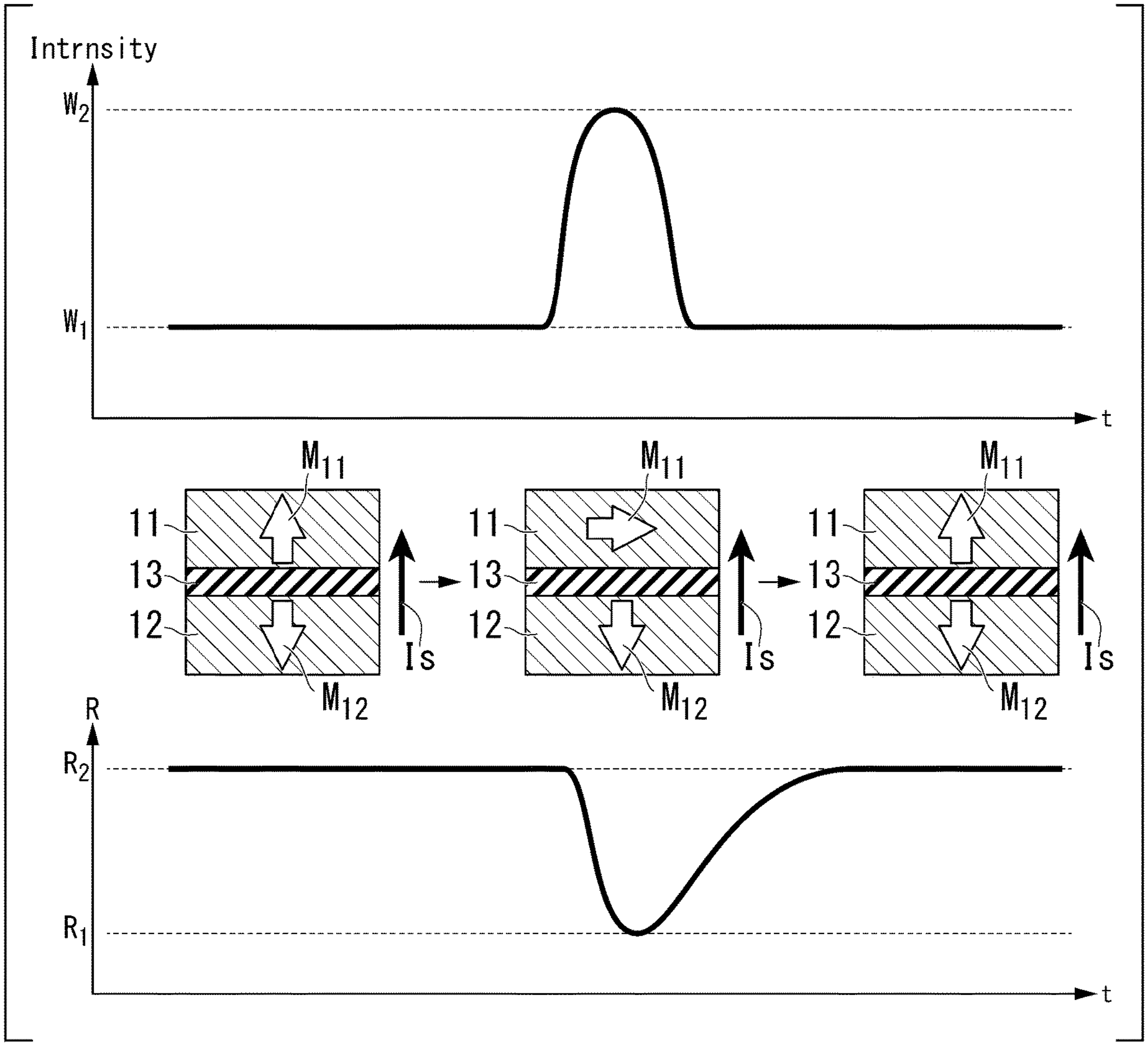
FIG. 4 is a diagram illustrating an example of an operation of the first magnetic element according to the first embodiment.
Figure 5:
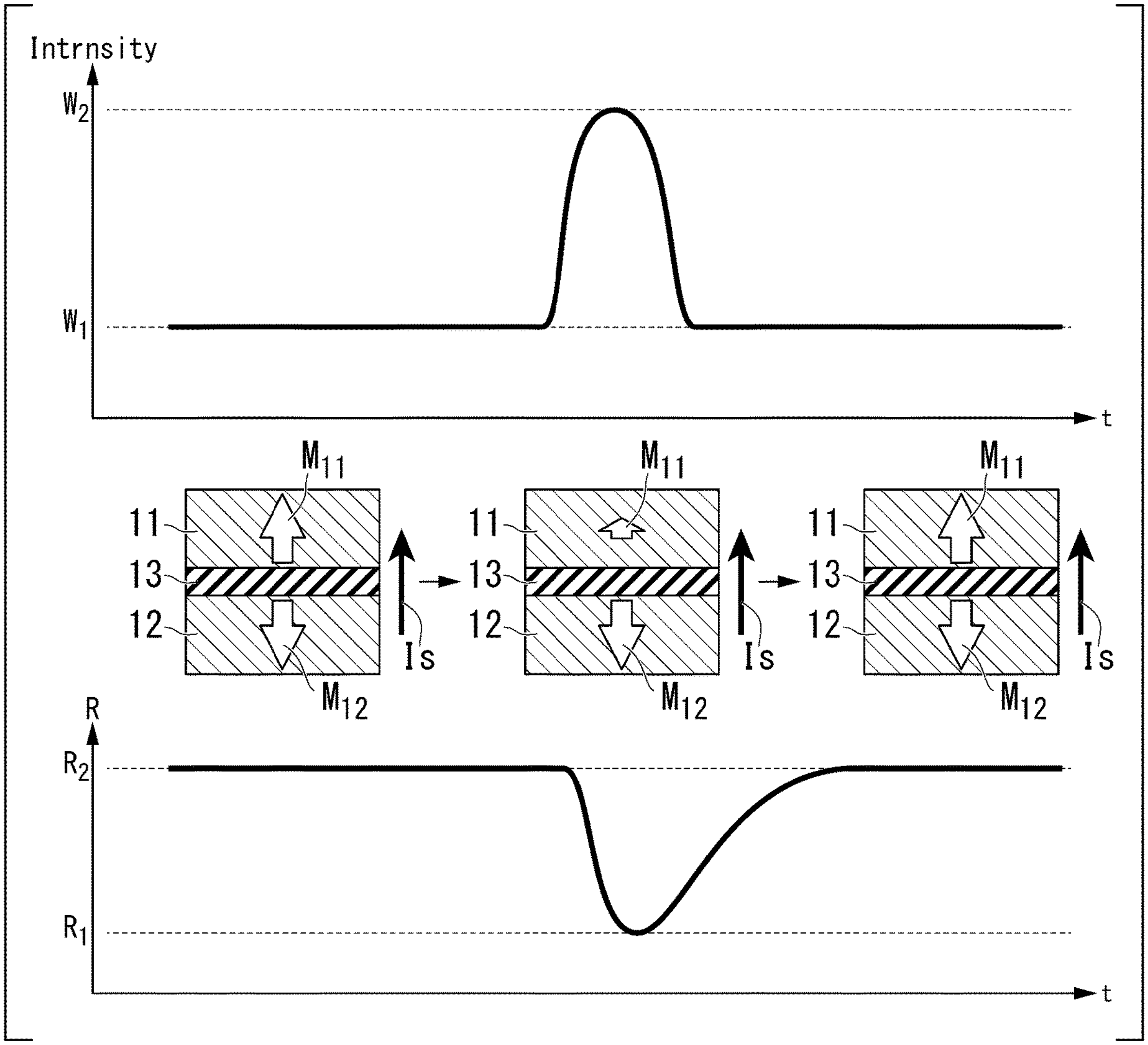
FIG. 5 is a diagram illustrating an example of the operation of the first magnetic element according to the first embodiment.

FIGS. 4 and 5 are diagrams illustrating an example of the operation of the first magnetic element 10 according to the first embodiment. FIG. 4 is a diagram illustrating a first mechanism of an operation example, and FIG. 5 is a diagram illustrating a second mechanism of the operation example. In upper graphs of FIGS. 4 and 5, a vertical axis represents the intensity of light with which the first ferromagnetic layer 11 is irradiated, and a horizontal axis represents time. In lower graphs of FIGS. 4 and 5, a vertical axis represents the resistance value of the first magnetic element 10 in the z direction, and a horizontal axis represents time.

First, in a state where the first ferromagnetic layer 11 is irradiated with light having a first intensity $W_1$ (hereinafter referred to as an initial state), the magnetization $M_{11}$ of the first ferromagnetic layer 11 and the magnetization $M_{12}$ of the second ferromagnetic layer 12 are in an antiparallel relationship, and the resistance value of the first magnetic element 10 in the z direction exhibits a second resistance value $R_2$. Here, a case where the intensity of the light with which the first ferromagnetic layer 11 is irradiated is zero may also be a state where the first ferromagnetic layer 11 is irradiated with light having the first intensity $W_1$.

When a sense current Is flows in the z direction of the first magnetic element 10, a voltage is generated at both ends of the first magnetic element 10 in the z direction. The output voltage from the first magnetic element 10 is generated between the first electrode 14 and the second electrode 15.

In the example illustrated in FIG. 4, it is preferable for the sense current Is to flow from the second ferromagnetic layer 12 to the first ferromagnetic layer 11. When the sense current Is flows in this direction, a spin transfer torque in a direction opposite to the magnetization $M_{12}$ of the second ferromagnetic layer 12 acts on the magnetization $M_{11}$ of the first ferromagnetic layer 11, and it is easy for the magnetization $M_{11}$ and the magnetization $M_{12}$ to come to an antiparallel state in the initial state.

Next, the intensity of the light with which the first ferromagnetic layer 11 is irradiated changes from the first intensity $W_1$ to a second intensity $W_2$. For example, when the first magnetic element 10 is irradiated with a light pulse, the intensity of the light with which the first ferromagnetic layer 11 is irradiated changes from the first intensity $W_1$ to the second intensity $W_2$. The light having the second intensity $W_2$ has a higher intensity than the light having the first intensity $W_1$.

The second intensity $W_2$ is higher than the first intensity $W_1$, and the magnetization $M_{11}$ of the first ferromagnetic layer 11 changes from its initial state. A state of the magnetization $M_{11}$ of the first ferromagnetic layer 11 in a state where the first ferromagnetic layer 11 is not irradiated with light is different from a state of the magnetization $M_{11}$ of the first ferromagnetic layer 11 irradiated with the light having the second intensity $W_2$. The state of the magnetization $M_{11}$ is, for example, an inclination angle with respect to the z direction, a magnitude, and the like.

For example, as illustrated in FIG. 4, when the intensity of the light with which the first ferromagnetic layer 11 is irradiated changes from the first intensity $W_1$ to the second intensity $W_2$, the magnetization $M_{11}$ tilts with respect to the z direction. Further, for example, as illustrated in FIG. 5, when the intensity of the light with which the first ferromagnetic layer 11 is irradiated changes from the first intensity $W_1$ to the second intensity $W_2$, a magnitude of the magnetization $M_{11}$ decreases. For example, when the magnetization $M_{11}$ of the first ferromagnetic layer 11 is tilted with respect to the z direction due to the intensity of light irradiation, the tilt angle is, for example, greater than 0° and smaller than 90°.

When the magnetization $M_{11}$ of the first ferromagnetic layer 11 changes from the initial state due to the irradiation of the first magnetic element 10 with a light pulse, the resistance value in the z direction of the first magnetic element 10 indicates a first resistance value $R_1$, and a magnitude of the output voltage from the first magnetic element 10 changes from the first value to the second value (the first magnetic element 10 outputs the first output). The first resistance value $R_1$ is smaller than the second resistance value $R_2$. The second value is smaller than the first value. The first resistance value $R_1$ is between a resistance value (second resistance value $R_2$) when the magnetization $M_{11}$ and the magnetization $M_{12}$ are antiparallel and a resistance value when the magnetization $M_{11}$ and the magnetization $M_{12}$ are parallel.

In the case illustrated in FIG. 4, a spin transfer torque in a direction opposite to the magnetization $M_{12}$ of the second ferromagnetic layer 12 acts on the magnetization Mu of the first ferromagnetic layer 11. Therefore, the magnetization $M_{11}$ tries to return to the antiparallel state with respect to the magnetization $M_{12}$, and when the intensity of the light with which the first ferromagnetic layer 11 is irradiated changes from the second intensity to the first intensity, the magnetization $M_{11}$ returns to the antiparallel state with respect to the magnetization $M_{12}$. In the case illustrated in FIG. 5, when the intensity of the light with which the first ferromagnetic layer 11 is irradiated returns to the first intensity $W_1$, the magnetization $M_{11}$ of the first ferromagnetic layer 11 returns to an original magnitude, and the first magnetic element 10 returns to the initial state. In either case, the resistance value of the first magnetic element 10 in the z direction returns to the second resistance value $R_2$. That is, when the intensity of the light with which the first ferromagnetic layer 11 is irradiated changes from the second intensity $W_2$ to the first intensity $W_1$, the resistance value of the first magnetic element 10 in the z direction changes from the first resistance value $R_1$ to the second resistance value $R_2$.

As illustrated in FIGS. 4 and 5, when the intensity of the light with which the first ferromagnetic layer 11 is irradiated changes from the second intensity $W_2$ to the first intensity $W_1$, the resistance value of the first magnetic element 10 in the z direction changes from the first resistance value $R_1$ to the second resistance value $R_2$. A time (falling time) required for the magnitude of the output voltage from the first magnetic element 10 to change from the second value to the first value by the resistance value of the first magnetic element 10 in the z direction changes from the first resistance value $R_1$ to the second resistance value $R_2$ is longer than a time required for the intensity of the light with which the first ferromagnetic layer 11 is irradiated to change from the second intensity $W_2$ to the first intensity $W_1$, and is longer than a time (rising time) required for the magnitude of the output voltage from the first magnetic element 10 to change from the first value to the second value.

Although the case where the magnetization $M_{11}$ and the magnetization $M_{12}$ are antiparallel in the initial state has been described herein, the magnetization $M_{11}$ and the magnetization $M_{12}$ may be parallel in the initial state. In this case, the resistance value of the first magnetic element 10 in the z direction increases as the state of the magnetization $M_{11}$ changes (for example, as the angular change from the initial state of the magnetization $M_{11}$ increases). When a case where the magnetization $M_{11}$ and the magnetization $M_{12}$ are parallel is defined as an initial state, it is preferable for the sense current Is to flow from the first ferromagnetic layer 11 to the second ferromagnetic layer 12. When the sense current Is flows in this direction, a spin transfer torque in the same direction as the magnetization $M_{12}$ of the second ferromagnetic layer 12 acts on the magnetization $M_{11}$ of the first ferromagnetic layer 11, and the magnetization $M_{11}$ and the magnetization $M_{12}$ becomes parallel in the initial state. When the magnetization $M_{11}$ and the magnetization $M_{12}$ are in an antiparallel relationship in the initial state, a falling time until an output voltage from the magnetic element after light pulse irradiation returns to the original state is shorter than when the magnetization $M_{11}$ and the magnetization $M_{12}$ are in a parallel relationship in the initial state.

The output voltage from the first magnetic element 10 changes depending on the intensity of light with which the first ferromagnetic layer 11 is irradiated. The first magnetic element 10 can convert the intensity of the light irradiated to the first magnetic element 10 into an output voltage from the first magnetic element 10, and can convert change in the intensity of the light irradiated to the first magnetic element 10 into change in an output voltage from the first magnetic element 10. Since the capacitor 91 passes only high frequency components of the output voltage, the change in the voltage of the first output with the output voltage from the first magnetic element 10 in the initial state as a reference is output as the first signal from the output terminal $t_1$.

Similarly, the output voltage from the second magnetic element 20 changes depending on the intensity of the light with which the first ferromagnetic layer 21 is irradiated. The second magnetic element 20 can convert the intensity of the light irradiated to the second magnetic element 20 into the output voltage from the second magnetic element 20, and can convert change in the intensity of the light irradiated to the second magnetic element 20 into change in the output voltage from the second magnetic element 20. Since the capacitor 91 passes only high frequency components of the output voltage, the change in the voltage of the second output with the output voltage from the second magnetic element 20 in the initial state as a reference is output as the second signal from the output terminal $t_1$.

The optical detection device 100 sums and combines the first signal and (with) the second signal generated when the first magnetic element 10 and the second magnetic element 20 are irradiated with the same light pulse, in the state where the first condition and the second condition are satisfied.

The first condition is satisfied, for example, by adjusting values of the currents supplied by the power supplies 31 and 32. The intensity of the first output changes with change in a value of a current supplied by the power supply 31. When the value of the current that the power supply 31 supplies to the first magnetic element 10 is greater, the first output increases and the first signal increases. Similarly, the intensities of the second output and the second signal change with change in a value of a current supplied by the power supply 32. Therefore, it is possible to change the absolute value of the amount of change until the first signal reaches the peak and the absolute value of the amount of change until the second signal reaches the peak, by adjusting the values of the currents supplied by the power supplies 31 and 32.

The second condition is satisfied when the polarity (sign) of the power supply 31 connected to the first surface 10A of the first magnetic element 10 on the output terminal $t_1$ side is different from the polarities (sign) of the power supply 32 connected to the first surface 20A on the output terminal $t_1$ side of the second magnetic element 20 in the optical detection device 100 according to the first embodiment.

The first magnetic element 10 and the second magnetic element 20 have different directions in which the sense current Is flows. An amount of change $\Delta V_{10}$ in the first output from the first magnetic element 10 due to the irradiation of the first magnetic element 10 with the light pulse is obtained by $\Delta V_{10}=\Delta R_{10}\times I$. In the equation, I is an absolute value of a current amount of the sense current Is. An amount of change $\Delta V_{20}$ in the second output from the second magnetic element 20 due to the irradiation of the second magnetic element 20 with the light pulse is obtained by $\Delta V_{20}=\Delta R_{20}\times -I$. $\Delta R_{10}$ is an amount of change in the resistance value of the first magnetic element 10 in the z direction due to the irradiation of the first magnetic element 10 with a light pulse. $\Delta R_{20}$ is an amount of change in a resistance value of the second magnetic element 20 in the z direction due to the irradiation of the second magnetic element 20 with a light pulse.

The resistance value of the first magnetic element 10 in the z direction decreases from the second resistance value $R_2$ to the first resistance value $R_1$ when the intensity of the light with which the first ferromagnetic layer 11 is irradiated changes from the first intensity to the second intensity, and increases from the first resistance value $R_1$ to the second resistance value $R_2$ when the intensity of the light with which the first ferromagnetic layer 11 is irradiated changes from the second intensity to the first intensity. Similarly, the resistance value of the second magnetic element 20 in the z direction decreases when the intensity of the light with which the first ferromagnetic layer 21 is irradiated changes from the first intensity to the second intensity, and increases when the intensity of the light with which the first ferromagnetic layer 21 is irradiated changes from the second intensity to the first intensity. That is, the first magnetic element 10 and the second magnetic element 20 have the same sign of an amount of change in resistance value due to irradiation with a light pulse.

Since the first magnetic element 10 and the second magnetic element 20 have different directions in which the sense current Is flows and have the same sign of the amount of change in resistance value due to the light pulse irradiation, the sign of the amount of change in the first output from the first magnetic element 10 due to the light pulse irradiation is opposite to the sign of the amount of change in the second output from the second magnetic element 20 due to the light pulse irradiation.

Figure 6:
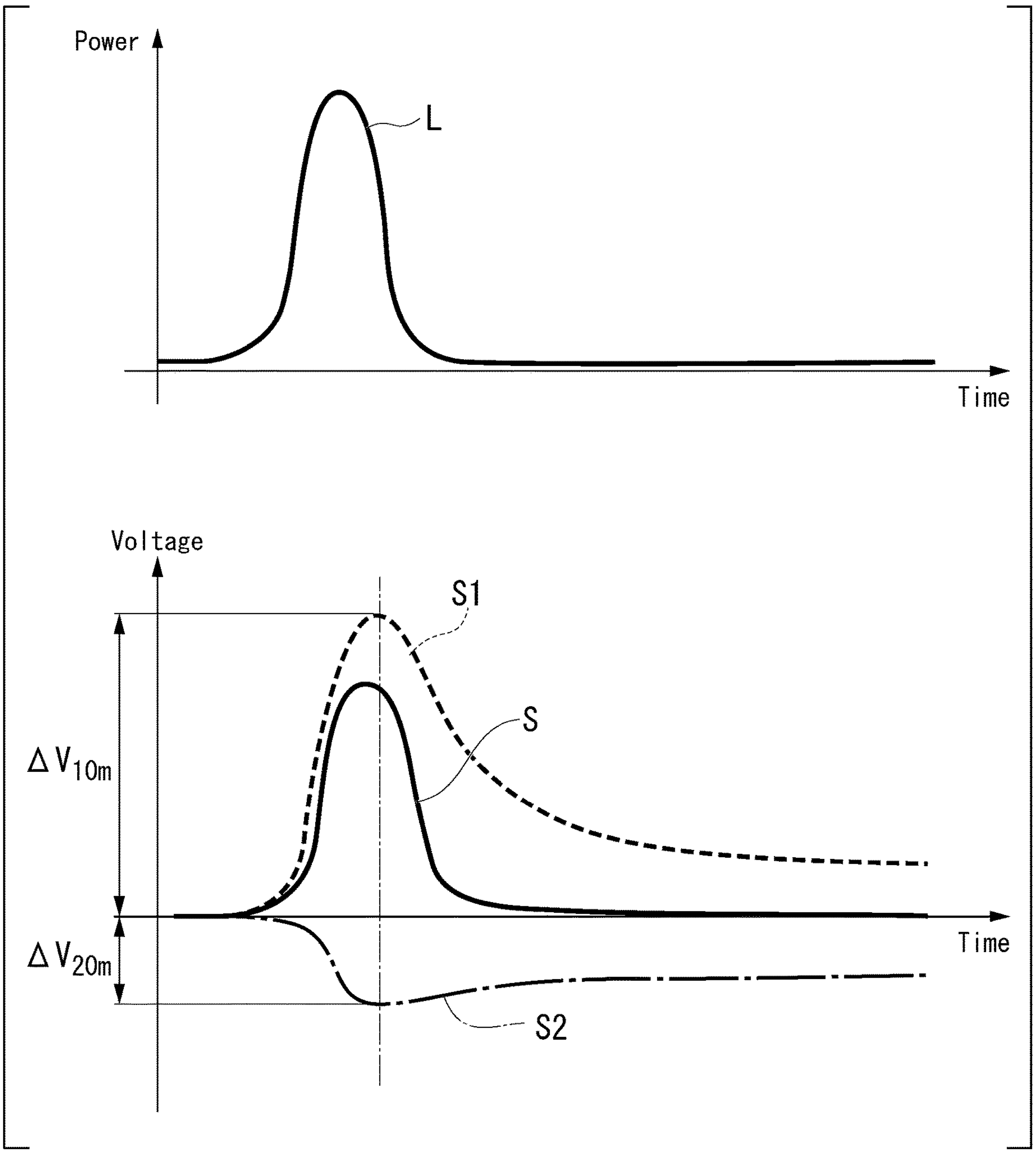
FIG. 6 is a schematic diagram illustrating output characteristics of the optical detection device with respect to a light pulse according to the first embodiment.

FIG. 6 illustrates output characteristics with respect to an light pulse of the optical detection device 100 according to the first embodiment. The first signal S1 is a signal caused by the first output from the first magnetic element 10, and is a signal obtained by extracting the change in the voltage of the first output. A second signal S2 is a signal caused by the second output from the second magnetic element 20, and is a signal obtained by extracting change in the voltage of the second output. As illustrated in FIG. 6, when the first magnetic element 10 and the second magnetic element 20 are irradiated with the light L in a pulsed manner, the first signal S1 and the second signal S2 are output. An amount of change $\Delta V_{10m}$ until the first signal S1 reaches the peak due to the light pulse irradiation is positive, and an amount of change $\Delta V_{20m}$ until the second signal reaches the peak due to the light pulse irradiation is negative. Thus, the optical detection device 100 satisfies the second condition. Further, an absolute value of the amount of change $\Delta V_{10m}$ until the first signal S1 reaches the peak due to the light pulse irradiation is different from the absolute value of the amount of change $\Delta V_{20m}$ until the second signal S2 reaches the peak due to the light pulse irradiation. Thus, the optical detection device 100 satisfies the first condition.

The optical detection device 100 sums and combines the first signal S1 and (with) the second signal S2. Since the first signal S1 and the second signal S2 have opposite signs, this process corresponds to a process of obtaining a difference between a magnitude (absolute value) of the first signal S1 and a magnitude (absolute value) of the second signal S2. In each of the first signal S1 and the second signal S2, a falling time from reaching the peak to returning to an original value is long, but the total output signal S from the optical detection device 100 that is a combination of the first signal S1 with the second signal S2 has a short falling time. This is because the first signal S1 and the second signal S2 generated when the first magnetic element 10 and the second magnetic element 20 are irradiated with the same light pulse are combined with each other in the state where the first condition and the second condition are satisfied, so that a falling portion of the total output signal S has a smaller absolute value because a falling portion of the first signal S1 and a falling portion of the second signal S2 are canceled out, and a peak portion of the total output signal S is not completely canceled out. That is, in the optical detection device 100 according to the first embodiment, the falling time of the output after pulsed light irradiation is short.

When the falling time of the output after pulsed light irradiation is long, irradiation with the next pulsed light may be performed before an output due to a previous pulsed light falls when irradiation with consecutive pulsed light is performed. In this case, the change in the output of the optical detection device 100 cannot keep up with the continuous pulse, and the change in the output of the optical detection device 100 becomes smaller over time. On the other hand, with the optical detection device 100 in which the falling time of the output after pulsed light irradiation is short, it is possible to curb the change in the output being smaller over time even when the pulsed light is continuously incident.

Figure 7:
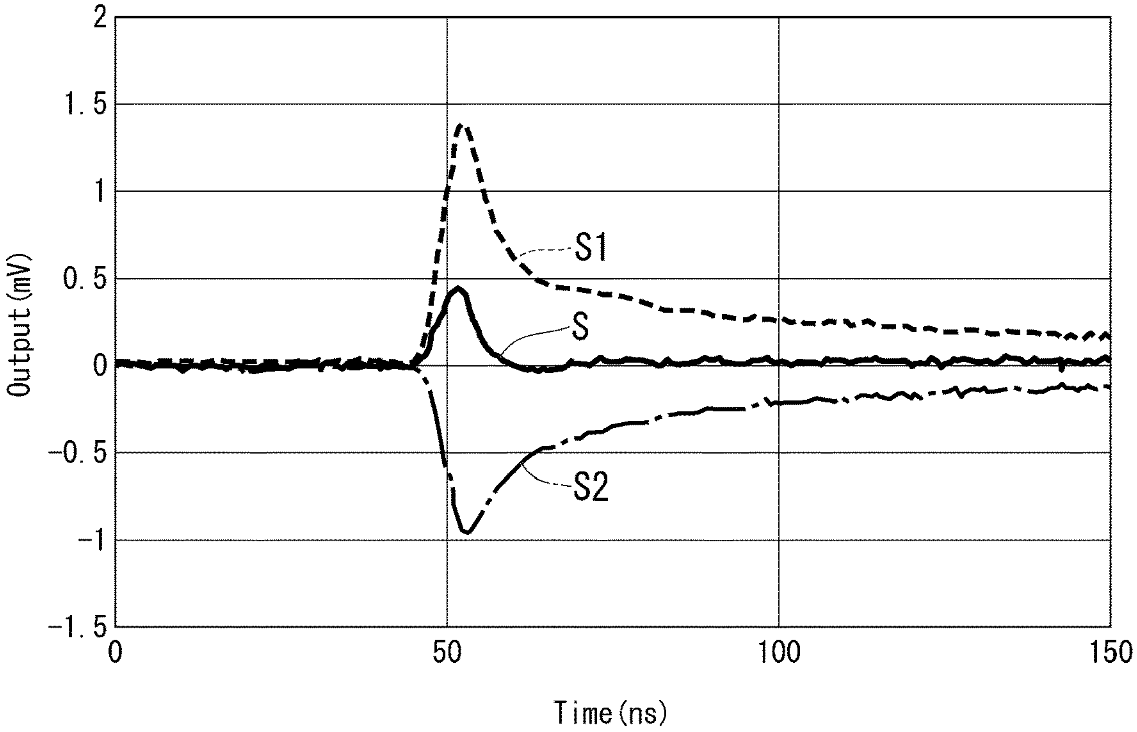
FIG. 7 is a graph showing measured values of a first signal caused by a first output from the first magnetic element, a second signal caused by a second output from the second magnetic element, and a total output from the optical detection device in the optical detection device according to a first example.
Figure 8:
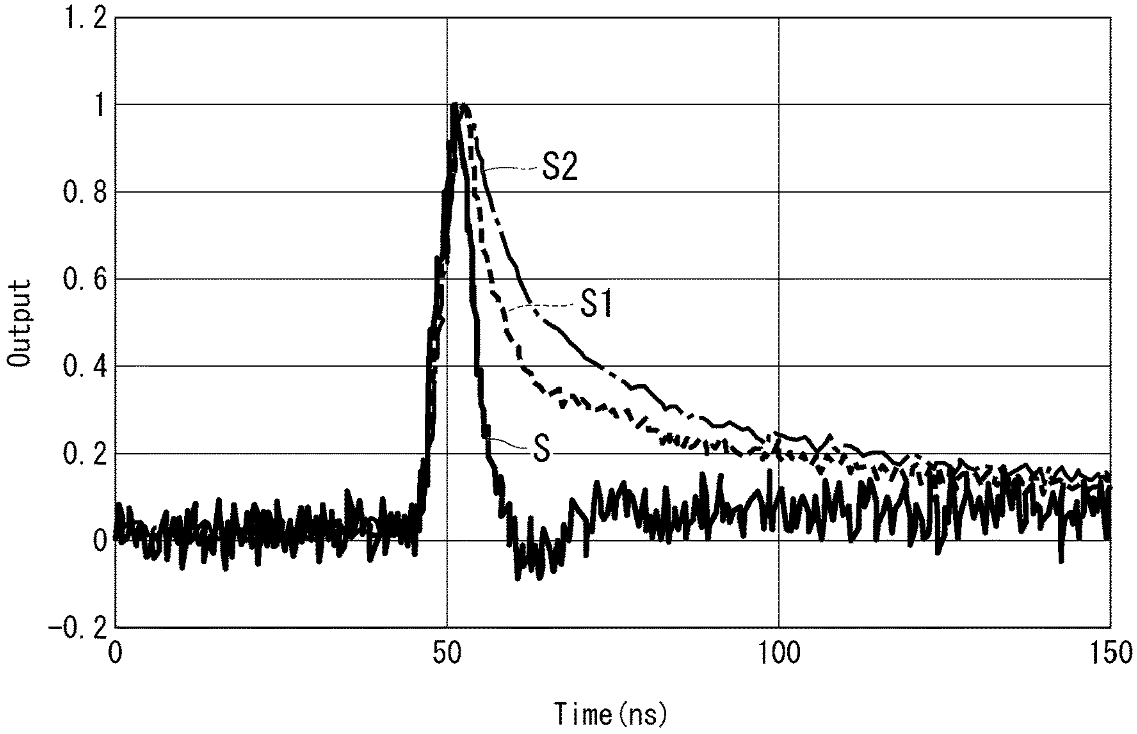
FIG. 8 is a graph showing that the first signal caused by the first output from the first magnetic element, the second signal caused by the second output from the second magnetic element, and the total output from the optical detection device are normalized by respective peak values in the optical detection device according to the first example.

FIGS. 7 and 8 show the output characteristics with respect to an light pulse of the optical detection device according to the first example. FIGS. 7 and 8 show results of obtaining the output characteristics of the optical detection device 100 with a configuration of the circuit diagram illustrated in FIG. 1.

FIG. 7 is a graph illustrating measured values of an output (the total output signal S) from the output terminal $t_1$ of the optical detection device 100, and an output (the first signal S1) caused by the first output from the first magnetic element 10 in the output from the output terminal $t_1$ and an output (the second signal S2) caused by the second output from the second magnetic element 20 in the output from the output terminal $t_1$. FIG. 8 is a graph in which the first signal S1, the second signal S2, and the total output signal S from the optical detection device 100 are normalized by respective peak values.

In the example illustrated in the graphs of FIGS. 7 and 8, the first magnetic element 10 was a cylinder with a diameter of 200 nm, a magnitude of a DC current applied from the power supply 31 to the first magnetic element 10 was 0.13 mA, the second magnetic element 20 was a cylinder with a diameter of 1 m, and a magnitude of a DC current applied from the power supply 32 to the second magnetic element 20 was 0.1 mA.

As illustrated in FIGS. 7 and 8, the optical detection device 100 according to the first embodiment has a shorter falling time of the output after pulsed light irradiation than that in a case where the first magnetic element 10 or the second magnetic element 20 is used alone. In this example, the absolute value of the amount of change until the second signal S2 reaches the peak is smaller than the absolute value of the amount of change until the first signal S1 reaches the peak. Further, the area of the first ferromagnetic layer 21 of the second magnetic element 20 when viewed from the z direction is larger than the area of the first ferromagnetic layer 11 of the first magnetic element 10 when viewed from the z direction, and the second signal S2 has a longer falling time than the first signal S1. Since the first signal S1 is combined with the second signal S2 in the state where the first condition and the second condition are satisfied, it is possible to enhance an effect of canceling out the falling portion of the first signal S1 and the falling portion of the second signal S2, and to further shorten a falling time with respect to a peak intensity of the total output signal S, while increasing a peak intensity of the total output signal S.

A case where the area of the first ferromagnetic layer 11 is made different from the area of the first ferromagnetic layer 21 when viewed from the z direction so that the time required for falling of the first output from the first magnetic element 10 is different from the time required for falling of the second output from the second magnetic element 20 has been illustrated above. However, a configuration in which the time required for falling of the first output from the first magnetic element 10 is different from the time required for falling of the second output from the second magnetic element 20 is not limited to this example.

Figure 9:
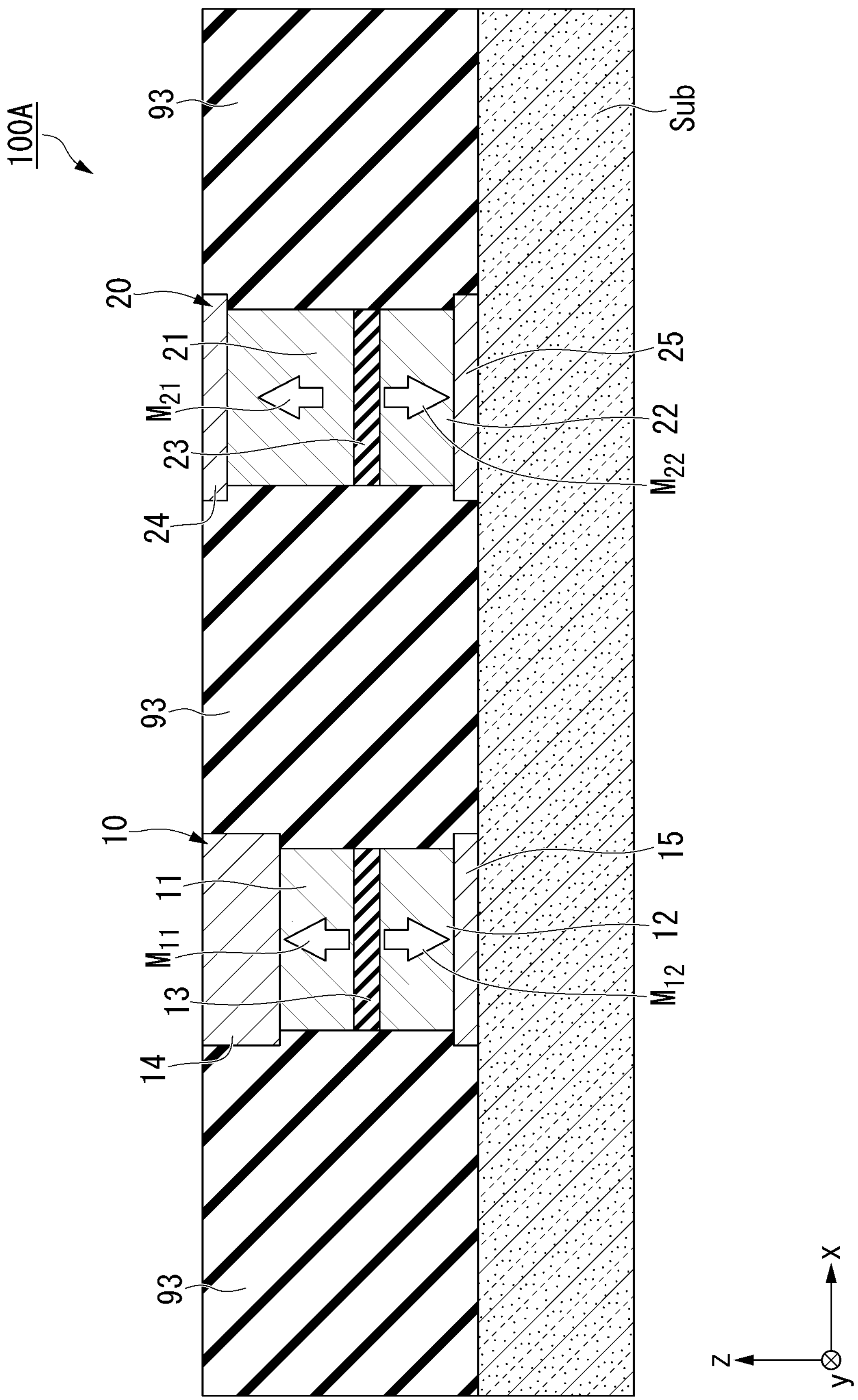
FIG. 9 is a sectional view of the vicinity of a first magnetic element and a second magnetic element of a first modification example of the optical detection device according to the first embodiment.

For example, as shown in an optical detection device 100A illustrated in FIG. 9, a thickness of the first ferromagnetic layer 11 of the first magnetic element 10 may be different from that of the first ferromagnetic layer 21 of the second magnetic element 20. For example, the thickness of the first ferromagnetic layer 21 of the second magnetic element 20 is larger than that of the first ferromagnetic layer 11 of the first magnetic element 10. When the thickness of the first ferromagnetic layer 11 is different from that of the first ferromagnetic layer 21, the time required for falling of the first output from the first magnetic element 10 is different from the time required for falling of the second output from the second magnetic element 20. When the thickness of the first ferromagnetic layer 11 increases, the falling time until the output from the magnetic element returns to the original state after irradiation with the light pulse becomes longer.

Figure 10:
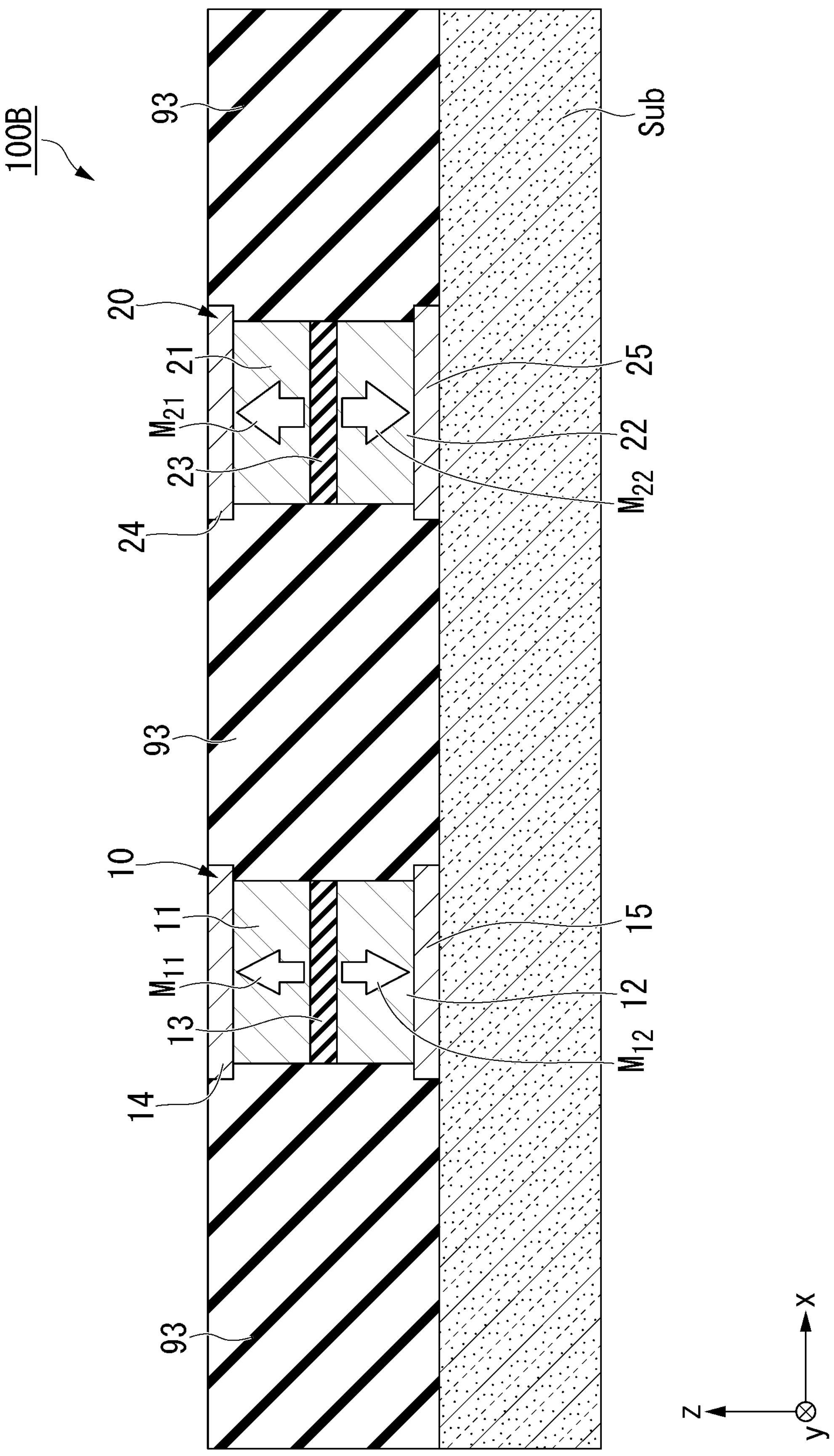
FIG. 10 is a sectional view of the vicinity of a first magnetic element and a second magnetic element of a second modification example of the optical detection device according to the first embodiment.

Further, for example, as shown in an optical detection device 100B illustrated in FIG. 10, the magnetic anisotropy of the first ferromagnetic layer 11 of the first magnetic element 10 may be different from that of the first ferromagnetic layer 21 of the second magnetic element 20. For example, the magnetic anisotropy of the magnetization $M_{21}$ of the first ferromagnetic layer 21 of the second magnetic element 20 is higher than that of the magnetization $M_{11}$ of the first ferromagnetic layer 11 of the first magnetic element 10. The magnetic anisotropy of the first ferromagnetic layer 11 and the first ferromagnetic layer 21 can change with a change in magnetic materials constituting the first ferromagnetic layers, for example. When the magnetic anisotropy of the first ferromagnetic layer 11 is different from that of the first ferromagnetic layer 21, the time required for falling of the first output from the first magnetic element 10 is different from the time required for falling of the second output from the second magnetic element 20. When the magnetic anisotropy of the first ferromagnetic layer increases, the falling time until the output from the magnetic element returns to the original state after irradiation with the light pulse becomes longer.

Figure 11:
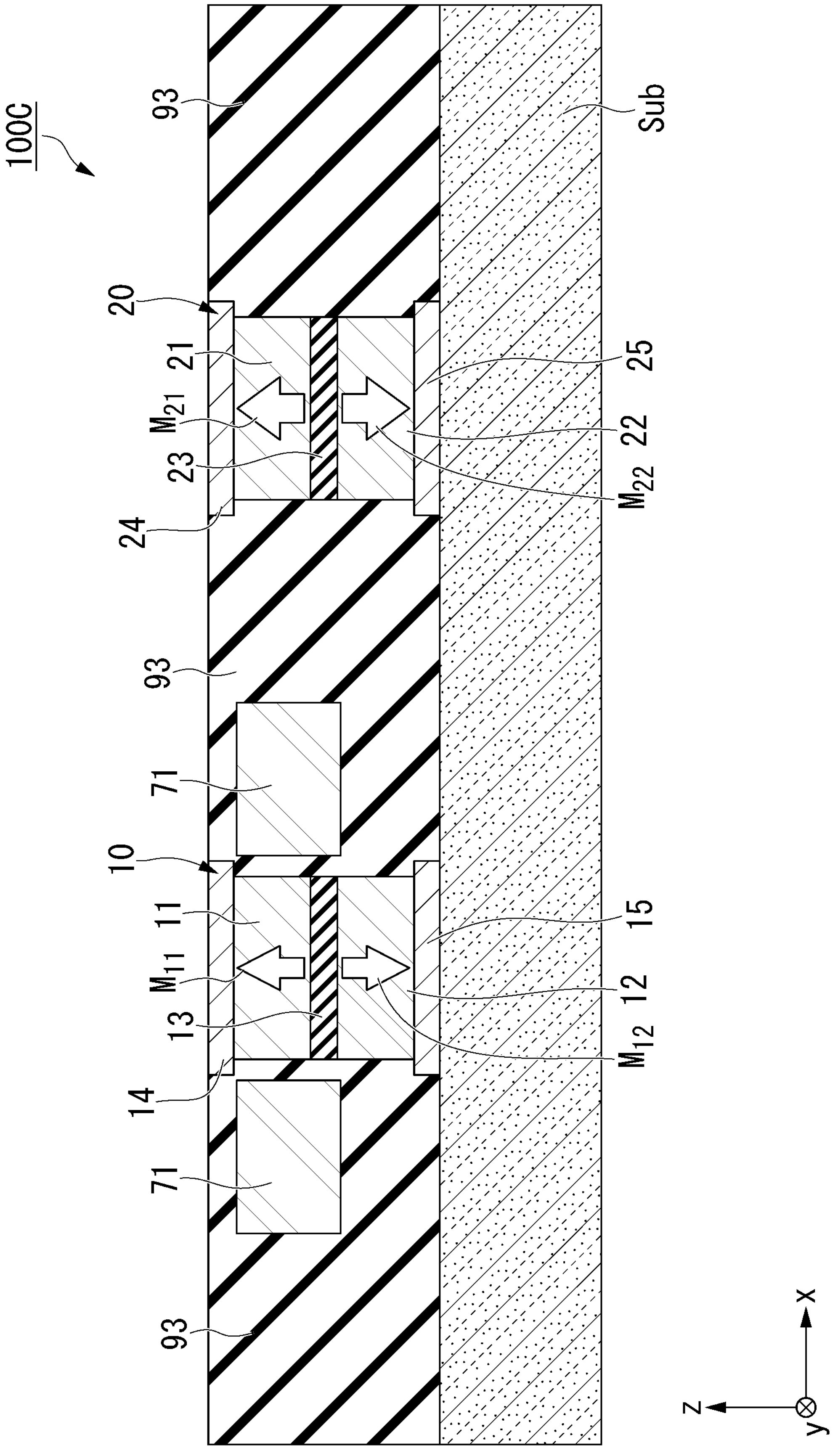
FIG. 11 is a sectional view of the vicinity of a first magnetic element and a second magnetic element of a third modification example of the optical detection device according to the first embodiment.

Furthermore, for example, as shown in an optical detection device 100C illustrated in FIG. 11, a highly thermally conductive layer 71 may be provided near the first magnetic element 10. For example, the highly thermally conductive layer 71 is located outside the first magnetic element 10 when viewed from the z direction. A distance between the highly thermally conductive layer 71 and the first magnetic element 10 is shorter than a distance between the highly thermally conductive layer 71 and the second magnetic element 20. The highly thermally conductive layer 71 has a higher thermal conductivity than the first electrode 14. The highly thermally conductive layer 71 is, for example, a metal such as copper, gold, or silver, or an insulator such as silicon carbide, aluminum nitride, or boron nitride. The thermal conductivity of the highly thermally conductive layer 71 is, for example, higher than 40 W/m·K.

The highly thermally conductive layer 71 releases heat generated in the first ferromagnetic layer 11. Because of the highly thermally conductive layer 71, the heat generated in the first ferromagnetic layer 11 is more easily dissipated than heat generated in the second ferromagnetic layer 21. Therefore, the magnetization $M_{11}$ of the first ferromagnetic layer 11 and the magnetization $M_{21}$ of the second ferromagnetic layer 21 differ in stability. The first magnetic element 10 located near the highly thermally conductive layer 71 has a shorter falling time until the output from the magnetic element returns to the original state after irradiation with the light pulse than the second magnetic element 2.

Second Embodiment

Figure 12:
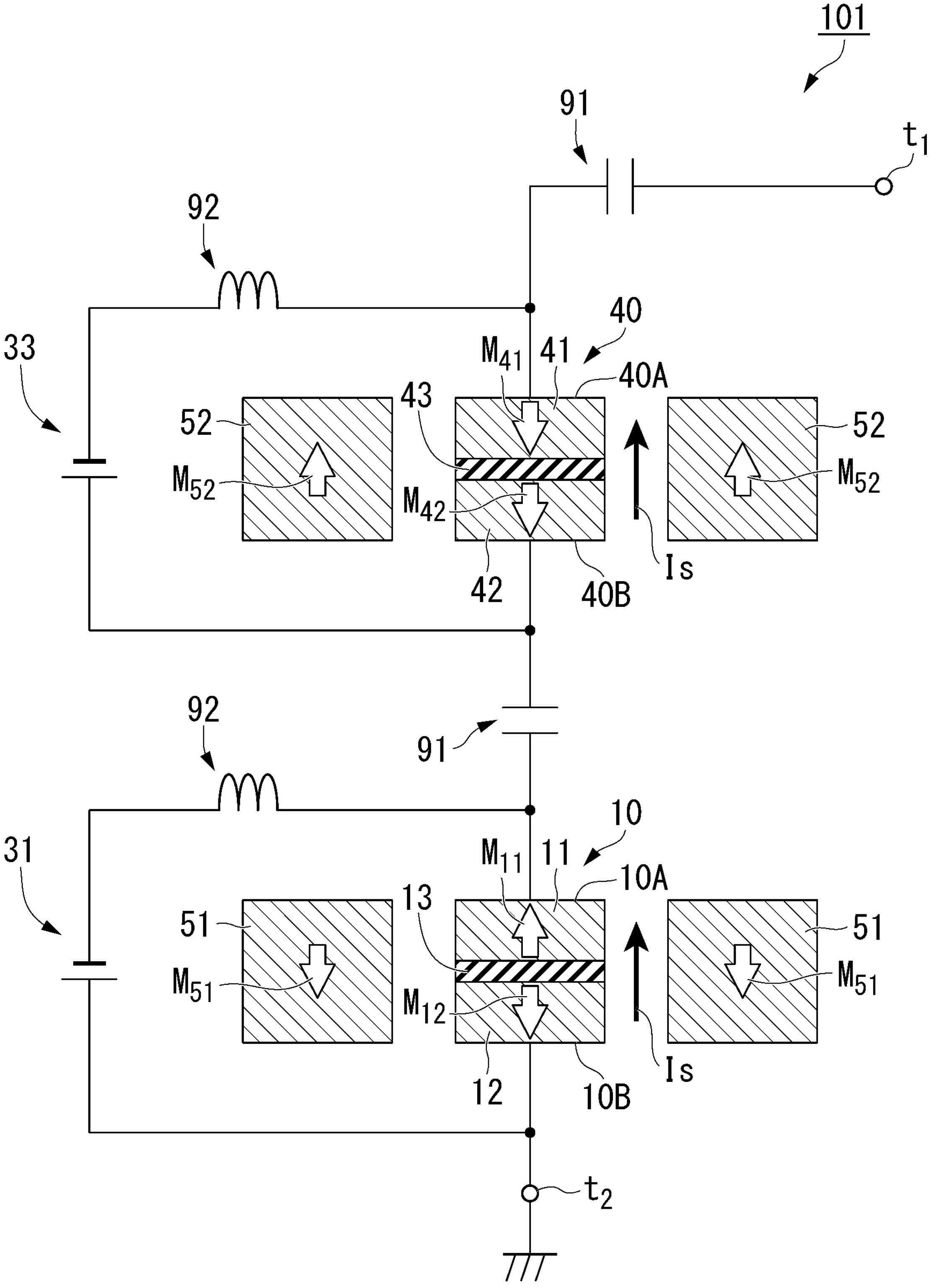
FIG. 12 is a circuit diagram of an optical detection device according to a second embodiment.

FIG. 12 is a circuit diagram of an optical detection device 101 according to a second embodiment. In the second embodiment, the same configurations as those in the first embodiment are denoted by the same reference signs, and description thereof will be omitted. In FIG. 12, directions of magnetization of a ferromagnetic material in a state where the optical detection device 101 is not irradiated with light are indicated by arrows.

The optical detection device 101 includes, for example, the first magnetic element 10, a second magnetic element 40, the capacitors 91, the inductors 92, the output terminal $t_1$, the reference potential terminal $t_2$, the magnetic field application unit 51, and the magnetic field application unit 52. The optical detection device 101 may include the power supply 31 and the power supply 33, and the power supply 31 and the power supply 33 may be external to the optical detection device 101. The second magnetic element 40 is an example of the second photoelectric conversion element.

Figure 13:
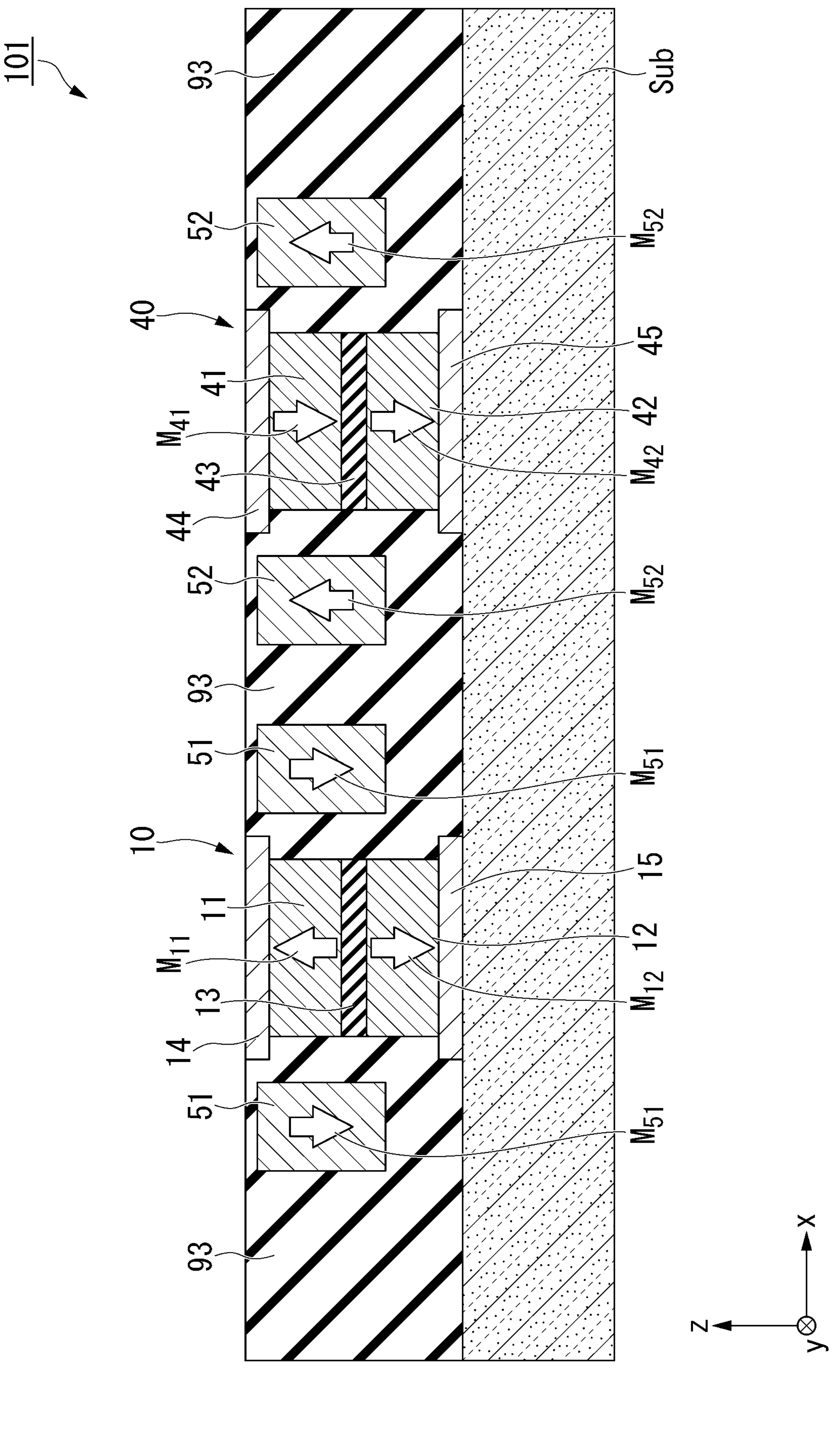
FIG. 13 is a cross-sectional view of the vicinity of a first magnetic element and a second magnetic element according to the second embodiment.

FIG. 13 is a cross-sectional view of the first magnetic element 10 and the second magnetic element 40 according to the second embodiment. In FIG. 13, directions of magnetization of a ferromagnetic material in a state where the optical detection device 101 is not irradiated with light are indicated by arrows.

The second magnetic element 40 is different from the second magnetic element 20 in that an area of the first ferromagnetic layer 11 viewed from the z direction is approximately the same as that of the first magnetic element 10. The second magnetic element 40 may be a magnetic element that has a ferromagnetic material whose magnetization state changes due to light irradiation and whose resistance value changes as the change in magnetization state.

The second magnetic element 40 includes, for example, a first ferromagnetic layer 41, a second ferromagnetic layer 42, and a spacer layer 43. The spacer layer 43 is located between the first ferromagnetic layer 41 and the second ferromagnetic layer 42. The first ferromagnetic layer 41 corresponds to the first ferromagnetic layer 21 in the second magnetic element 20. A constituent material, film thickness, layer structure, and the like of the first ferromagnetic layer 41 can be the same as those of the first ferromagnetic layer 21. The second ferromagnetic layer 42 corresponds to the second ferromagnetic layer 22 in the second magnetic element 20. A constituent material, film thickness, layer structure, and the like of the second ferromagnetic layer 42 can be the same as those of the second ferromagnetic layer 22. The spacer layer 43 corresponds to the spacer layer 23 in second magnetic element 20. A constituent material, film thickness, layer structure, and the like of the spacer layer 43 can be the same as those of the spacer layer 23. Further, the second magnetic element 40 may include an underlayer, a cap layer, a perpendicular magnetization inducing layer, and the like, like the first magnetic element 10.

The second magnetic element 40 is connected to the first electrode 44 and the second electrode 45. The first electrode 44 is in contact with a light irradiation surface of the second magnetic element 40. The second electrode 45 is in contact with a surface that faces the light irradiation surface of the second magnetic element 40. A constituent material and film thickness of the first electrode 44 are the same as those of the first electrode 24. A constituent material and film thickness of the second electrode 45 are the same as those of the second electrode 25.

The second magnetic element 40 is different from the second magnetic element 20 in that the magnetization $M_{41}$ of the first ferromagnetic layer 41 and the magnetization $M_{42}$ of the second ferromagnetic layer 42 are parallel in a state where the second magnetic element 40 is not irradiated with light. In the second embodiment, the relationship between the magnetization directions of the first ferromagnetic layer 11 and the second ferromagnetic layer 12 of the first magnetic element 10 is different from a relationship between the magnetization directions of the first ferromagnetic layer 41 and the second ferromagnetic layer 42 of the second magnetic element 40 in a state where the first magnetic element 10 and the second magnetic element 40 are not irradiated with light. For example, the relationship between the magnetization directions of the first ferromagnetic layer 11 and the second ferromagnetic layer 12 of the first magnetic element 10 is antiparallel, and the relationship between the magnetization directions of the first ferromagnetic layer 41 and the second ferromagnetic layer 42 of the second magnetic element 40 are parallel. The second embodiment is not limited to this example, and in the state where the first magnetic element 10 and the second magnetic element 40 are not irradiated with light, the relationship between the magnetization directions of the first ferromagnetic layer 11 and the second ferromagnetic layer 12 of the first magnetic element 10 may be parallel, and the relationship between the magnetization directions of the first ferromagnetic layer 41 and the second ferromagnetic layer 42 of the second magnetic element 40 may be antiparallel.

The power supply 33 is a DC power supply and is connected to the second magnetic element 40. As the power supply 33, the same power supply as the power supply 31 can be used. The power supply 33 applies a DC current or DC voltage to the second magnetic element 40. The optical detection device 101 is configured, for example, such that a first surface 40A of the second magnetic element 40 on the output terminal $t_1$ side is connected to the negative terminal of the power supply 33, and a second surface 40B facing the first surface 40A of the second magnetic element 40 is connected to the positive terminal of the power supply 33.

The optical detection device 101 is configured such that a polarity (sign) of the power supply 31 connected to the first surface 10A of the first magnetic element 10 on the output terminal $t_1$ side is the same as a polarity (sign) of the power supply 33 connected to the first surface 40A on the output terminal $t_1$ side of the second magnetic element 40. Here, although an example in which the first surface 10A is connected to the negative terminal of the power supply 31, the second surface 10B is connected to the positive terminal of the power supply 31, the first surface 40A is connected to the negative terminal of the power supply 33, and the second surface 40B is connected to the positive terminal of the power supply 33 has been illustrated, the first surface 10A may be connected to the positive terminal of the power supply 31, the second surface 10B may be connected to the negative terminal of the power supply 31, the first surface 40A may be connected to the positive terminal of the power supply 33, and the second surface 40B may be connected to the negative terminal of the power supply 33.

The magnetic field application unit 51 is at a position at which the first magnetic element 10 is sandwiched, for example, in an in-film-surface magnetization film (x direction in the example of FIG. 13). The magnetization $M_{11}$ of the first ferromagnetic layer 11 is oriented in a direction antiparallel to the magnetization $M_{12}$ of the second ferromagnetic layer 12 in a state where a leakage magnetic field from the magnetic field application unit 51 is applied as a bias magnetic field so that the first magnetic element 10 is not irradiated with light. The magnetic field application unit 51 is at a position at which light with which the first magnetic element 10 is irradiated is not blocked. The magnetic field application unit 51 includes, for example, a hard magnetic material.

The magnetic field application unit 52 is at a position at which the second magnetic element 40 is sandwiched, for example, in the in-film-surface magnetization film (x direction in the example of FIG. 13). The magnetization $M_{41}$ of the first ferromagnetic layer 41 is oriented in a direction parallel to the magnetization $M_{42}$ of the second ferromagnetic layer 42 in which the second magnetic element 40 is not irradiated with light, by a leakage magnetic field from the magnetic field application unit 52 being applied as the bias magnetic field. The magnetic field application unit 52 is located at a position at which the light with which the second magnetic element 40 is irradiated is not blocked. The magnetic field application unit 52 includes, for example, a hard magnetic material.

Next, an operation of the optical detection device 101 will be described. When the first magnetic element 10 is irradiated with a light pulse, the first magnetic element 10 outputs a first output, and change in a voltage of the first output with the output voltage from the first magnetic element 10 in the initial state as a reference is output as the first signal from the output terminal $t_1$. The first signal is a signal caused by the first output. Similarly, when the second magnetic element 40 is irradiated with a light pulse, the second magnetic element 40 outputs a second output, and the change in voltage of the second output with the output voltage from the second magnetic element 40 in the initial state as a reference is output as the second signal from the output terminal $t_1$. The second signal is a signal caused by the second output.

The optical detection device 101 combines the first signal with the second signal according to a predetermined signal processing method and outputs a combination signal from the output terminal $t_1$. The optical detection device 101 combines the first signal with the second signal when the first magnetic element 10 and the second magnetic element 40 are irradiated with the same light pulse in a state where the first condition and the second condition are satisfied.

The first condition can be satisfied, for example, by adjusting the values of the currents supplied by the power supply 31 and the power supply 33. It is possible to change the absolute value of the amount of change until the first signal reaches the peak and the absolute value of the amount of change until the second signal reaches the peak, by adjusting the values of the currents supplied by the power supply 31 and the power supply 33.

The second condition can be satisfied when the relationship between the magnetization directions of the first ferromagnetic layer 11 and the second ferromagnetic layer 12 of the first magnetic element 10 is different from the relationship between the magnetization directions of the first ferromagnetic layer 41 and the second ferromagnetic layer 42 of the second magnetic element 40 in the state where the first magnetic element 10 and the second magnetic element 40 are not irradiated with light.

The resistance value of the first magnetic element 10 in the z direction decreases from the second resistance value $R_2$ to the first resistance value $R_1$ when the intensity of the light with which the first ferromagnetic layer 11 is irradiated changes from the first intensity to the second intensity, and increases from the first resistance value $R_1$ to the second resistance value $R_2$ when the intensity of the light with which the first ferromagnetic layer 11 is irradiated changes from the second intensity to the first intensity. On the other hand, a resistance value of the second magnetic element 40 in the z direction increases when the intensity of the light with which the first ferromagnetic layer 41 is irradiated changes from the first intensity to the second intensity, and decreases when the intensity of the light with which the first ferromagnetic layer 41 is irradiated changes from the second intensity to the first intensity. That is, the first magnetic element 10 and the second magnetic element 40 differ in sign of the amount of change in resistance value due to the light pulse irradiation.

In the first magnetic element 10 and the second magnetic element 40, since a direction in which the sense current Is flows is the same, and the sign of the amount of change in resistance value due to the irradiation with the light pulse is different, a sign of an amount of change in the first signal caused by the first output from the first magnetic element 10 due to the irradiation with the light pulse is opposite to a sign of an amount of change in the second signal caused by the second output from the second magnetic element 40 due to the light pulse irradiation. Therefore, in the optical detection device 101 according to the second embodiment, when the first magnetic element 10 and the second magnetic element 40 are irradiated with the same light pulse, the absolute value of the amount of change until the first signal reaches the peak is different from the absolute value of the amount of change until the second signal reaches the peak, and the sign of the amount of change until the first signal reaches the peak is opposite to the sign of the amount of change until the second signal reaches the peak, and when these are combined, a falling time of the output of the optical detection device 101 after pulsed light irradiation is short.

Figure 14:
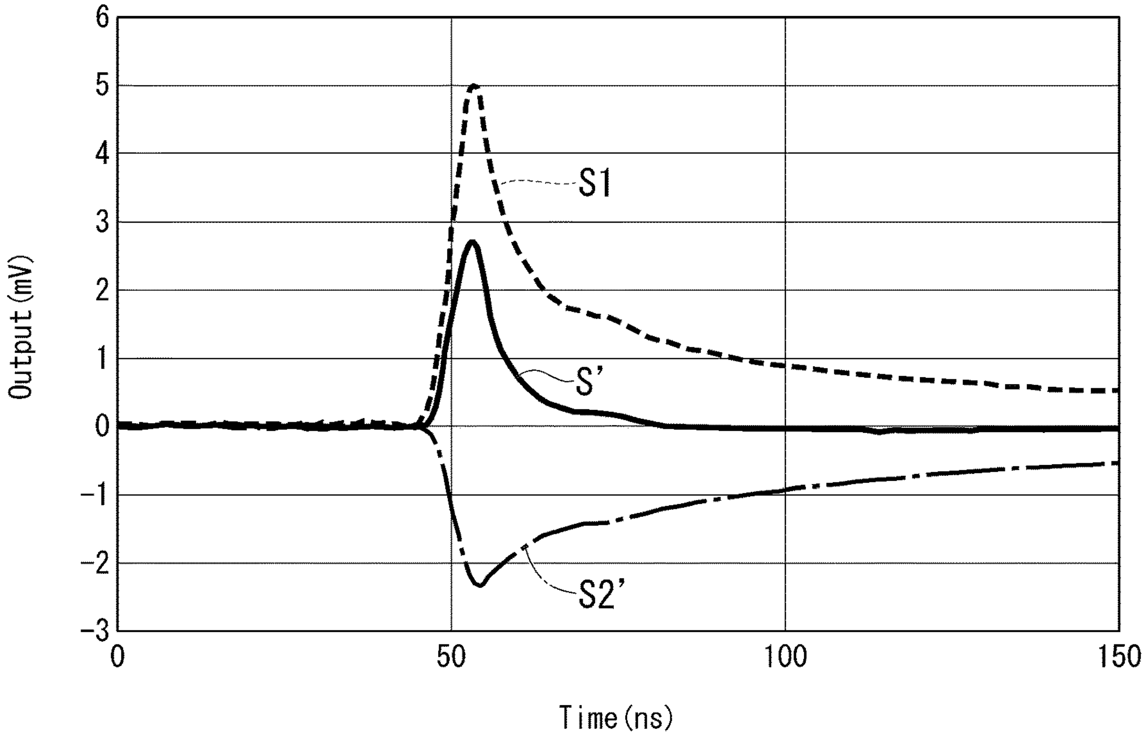
FIG. 14 is a graph showing measured values of a first signal caused by a first output from a first magnetic element, a second signal caused by a second output from a second magnetic element, and a total output from the optical detection device in the optical detection device according to a second example.
Figure 15:
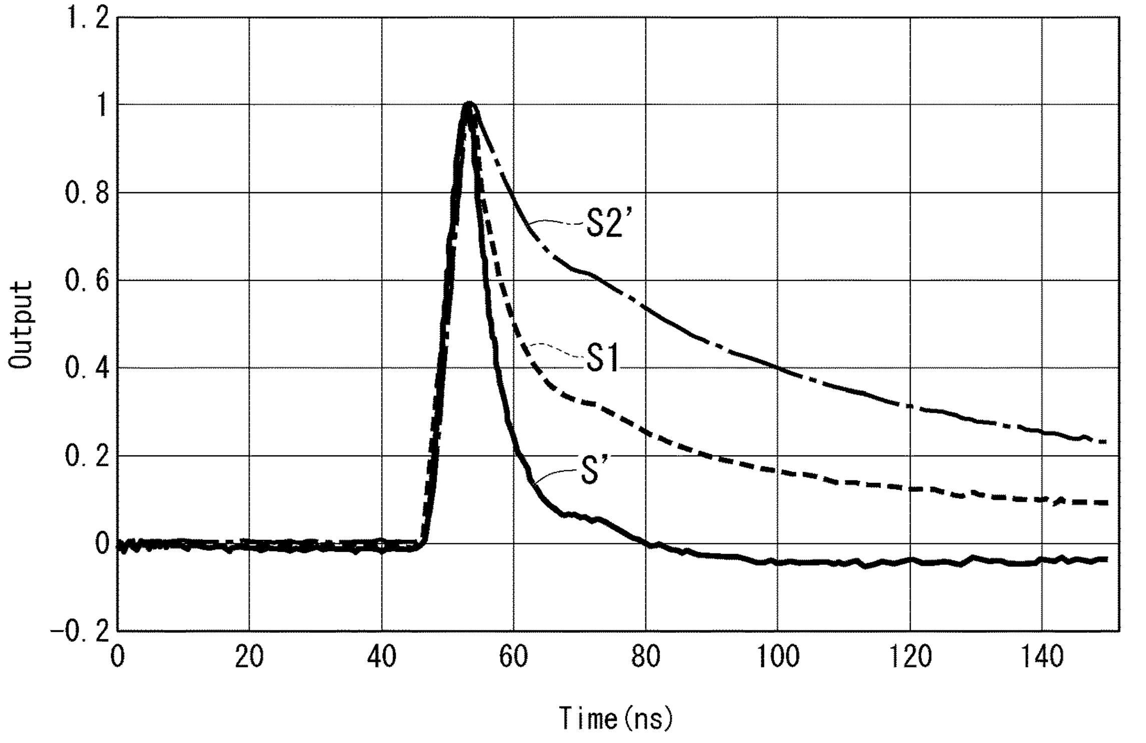
FIG. 15 is a graph showing that the first signal caused by the first output from the first magnetic element, the second signal caused by the second output from the second magnetic element, and the total output from the optical detection device are normalized by respective peak values in the optical detection device according to the second example.

FIGS. 14 and 15 show output characteristics with respect to an light pulse of the optical detection device according to the second example. FIGS. 14 and 15 show results of obtaining the output characteristics of the optical detection device 101 using the configuration in the circuit diagram illustrated in FIG. 12.

FIG. 14 shows measured values of an output (a total output signal S') from the output terminal $t_1$ of the optical detection device 101, an output (the first signal S1) caused by the first output from the first magnetic element 10 in the output from the output terminal $t_1$, and an output (a second signal S2') caused by the second output from the second magnetic element 40 in the output from the output terminal $t_1$. FIG. 15 is a graph showing that the first signal S1 from the first magnetic element 10, the second signal S2' from the second magnetic element 40, and the total output signal S' from the optical detection device 101 are normalized by respective peak values.

In the example illustrated in the graphs of FIGS. 14 and 15, the first magnetic element 10 was a cylinder with a diameter of 200 nm, a magnitude of the DC current applied from the power supply 31 to the first magnetic element 10 was 0.76 mA, the second magnetic element 40 was a cylinder with a diameter of 200 nm, and a magnitude of the DC current applied from the power supply 33 to the second magnetic element 20 was 0.42 mA. In the state where the first magnetic element 10 and the second magnetic element 40 are not irradiated with light, the magnetization $M_{11}$ of the first ferromagnetic layer 11 and the magnetization $M_{12}$ of the second ferromagnetic layer 12 are in an antiparallel relationship in the first magnetic element 10, and the magnetization $M_{41}$ of the first ferromagnetic layer 41 and the magnetization $M_{42}$ of the second ferromagnetic layer 42 are in a parallel relationship in the second magnetic element 40.

As illustrated in FIGS. 14 and 15, in the optical detection device 101 according to the second embodiment, the falling time of the output after pulsed light irradiation is shorter than that in a case where the first magnetic element 10 or the second magnetic element 40 is used alone. In this example, an absolute value of the amount of change until the second signal S2' reaches a peak is smaller than an absolute value of the amount of change until the first signal S1' reaches the peak. Further, in the state where the first magnetic element 10 and the second magnetic element 40 are not irradiated with light, the magnetization $M_{11}$ of the first ferromagnetic layer 11 and the magnetization $M_{12}$ of the second ferromagnetic layer 12 of the first magnetic element 10 are in an antiparallel relationship, the magnetization $M_{41}$ of the first ferromagnetic layer 41 and the magnetization $M_{42}$ of the second ferromagnetic layer 42 of the second magnetic element 40 are in a parallel relationship, and the second signal S2' has a longer falling time than the first signal S1. It is possible to enhance an effect of canceling out the falling portion of the first signal S1 and the falling portion of the second signal S2', and to further shorten a falling time with respect to the peak intensity of the total output signal S', while increasing the peak intensity of the total output signal S' by combing the first signal S1 with the second signal S2' in the state where the first condition and the second condition are satisfied.

Although an example of the second embodiment has been illustrated so far, the optical detection device 101 according to the second embodiment is not limited to this example.

Figure 16:
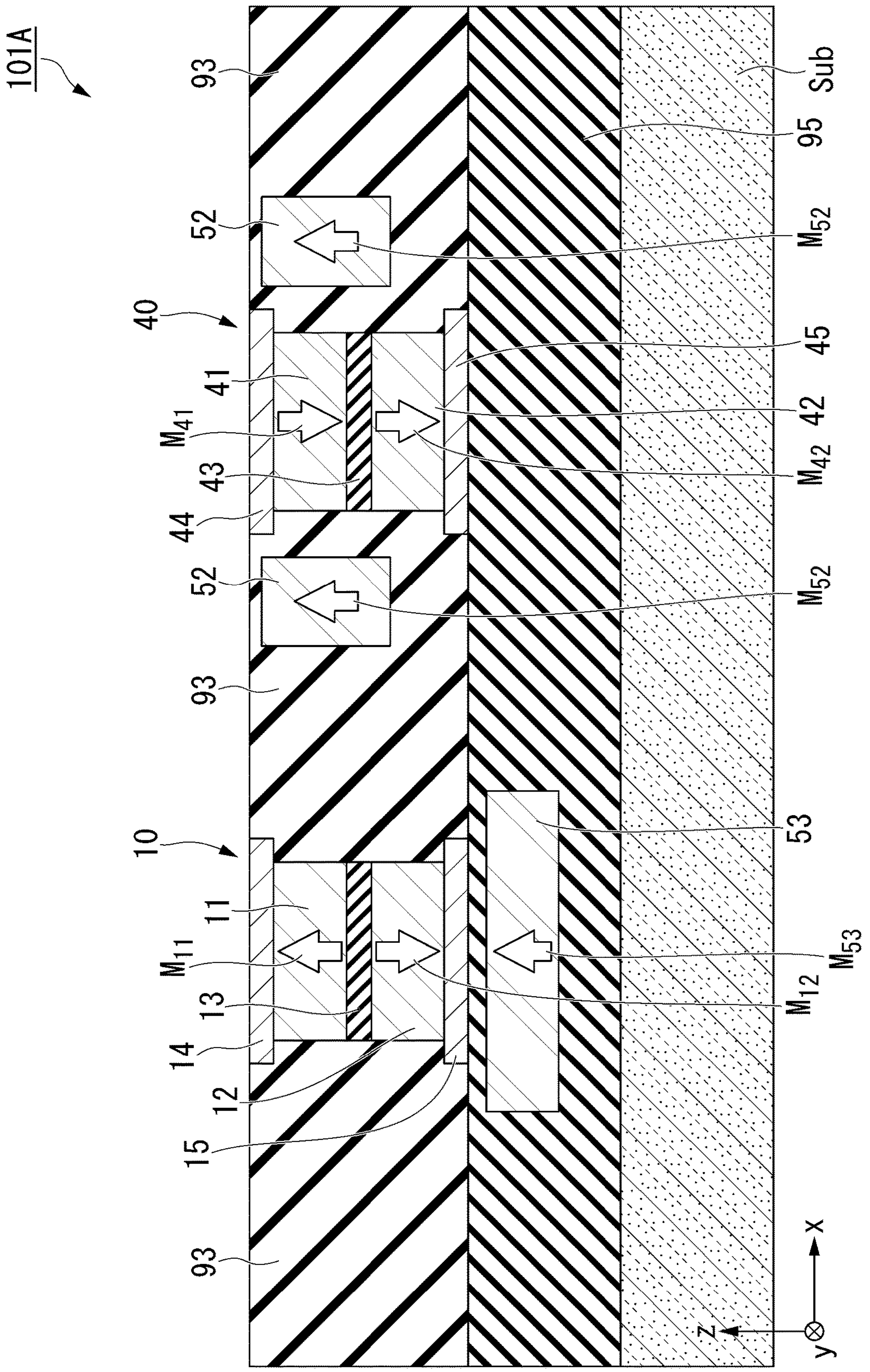
FIG. 16 is a cross-sectional view of the vicinity of a first magnetic element and a second magnetic element of a first modification example of the optical detection device according to the second embodiment.

For example, FIG. 16 is a cross-sectional view of the vicinity of the first magnetic element 10 and the second magnetic element 40 of a first modification example of the optical detection device according to the second embodiment. In FIG. 16, directions of magnetization of a ferromagnetic material in the state where the first magnetic element 10 and the second magnetic element 40 are not irradiated with light are indicated by arrows.

The optical detection device 101A is provided with a magnetic field application unit 53 in place of the magnetic field application unit 51 of the optical detection device 101.

The magnetic field application unit 53 is located at a position overlapping the first magnetic element 10 in the z direction. The magnetic field application unit 53 is disposed, for example, in the intermediate layer 95 between the substrate Sub and the insulating layer 93. The magnetization $M_{11}$ of the first ferromagnetic layer 11 is oriented in a direction antiparallel to the magnetization $M_{12}$ of the second ferromagnetic layer 12 in a state where the first magnetic element 10 is not irradiated with light, by a leakage magnetic field from the magnetic field application unit 53 being applied as a bias magnetic field. The magnetic field application unit 53 is at a position at which the light with which the first magnetic element 10 is irradiated is not blocked. The magnetic field application unit 53 includes, for example, a hard magnetic material.

Since the optical detection device 101A combines the first signal with the second signal in the state where the first condition and the second condition are satisfied, the same effect as the optical detection device 101 according to the second embodiment is achieved. Although FIG. 16 illustrates an example in which the magnetic field application unit 53 is provided in place of the magnetic field application unit 51 of the optical detection device 101, the magnetic field application unit may be provided at a position overlapping the second magnetic element 40 in the z direction in place of the magnetic field application unit 52.

Figure 17:
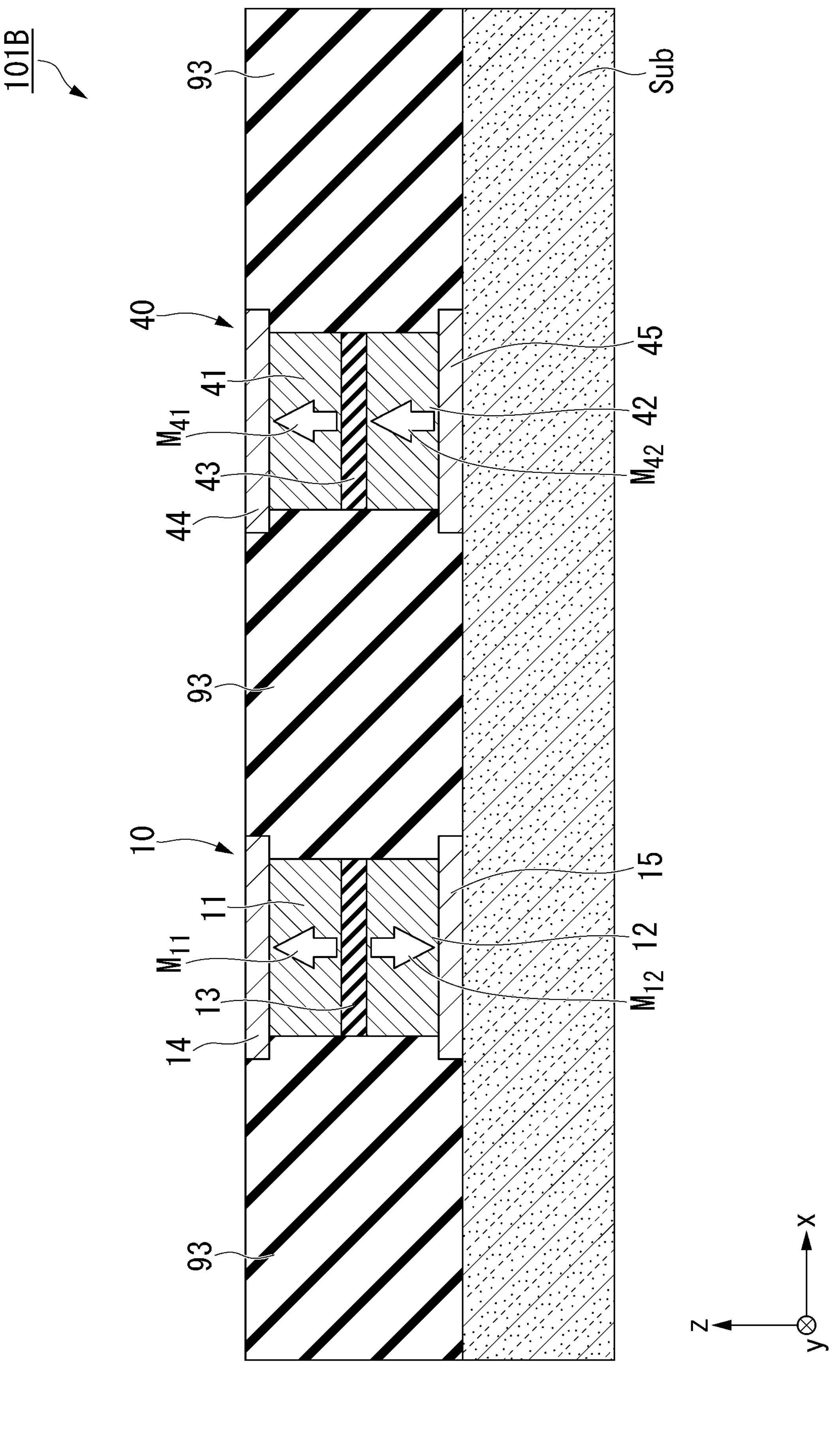
FIG. 17 is a cross-sectional view of the vicinity of a first magnetic element and a second magnetic element of a second modification example of the optical detection device according to the second embodiment.

Further, for example, FIG. 17 is a cross-sectional view of the vicinity of the first magnetic element 10 and the second magnetic element 40 of a second modification example of the optical detection device according to the second embodiment. In FIG. 17, directions of magnetization of a ferromagnetic material in the state where the first magnetic element 10 and the second magnetic element 40 are not irradiated with light are indicated by arrows.

The optical detection device 101B is different from the optical detection device 100 in that the optical detection device 101B does not include the magnetic field application unit 51 and the magnetic field application unit 52. Further, in the optical detection device 101B, a direction of the magnetization $M_{12}$ of the second ferromagnetic layer 12 of the first magnetic element 10 is opposite to a direction of the magnetization $M_{42}$ of the second ferromagnetic layer 42 of the second magnetic element 40 in the state where the first magnetic element 10 and the second magnetic element 40 are not irradiated with light. An orientation direction of magnetization of the second ferromagnetic layer 12 and the second ferromagnetic layer 42 can be designed at the time of manufacturing. Further, the magnetization $M_{11}$ of the first ferromagnetic layer 11 and the magnetization $M_{12}$ of the second ferromagnetic layer 12 are in an antiparallel relationship in the state where the first magnetic element 10 and the second magnetic element 40 are not irradiated with light, and the magnetization $M_{41}$ of the first ferromagnetic layer 41 and the magnetization $M_{42}$ of the second ferromagnetic layer 42 are in a parallel relationship.

Since the optical detection device 101B combines the first signal with the second signal in the state where the first condition and the second condition are satisfied, the same effects as the optical detection device 101 according to the second embodiment is achieved.

Third Embodiment

Figure 18:
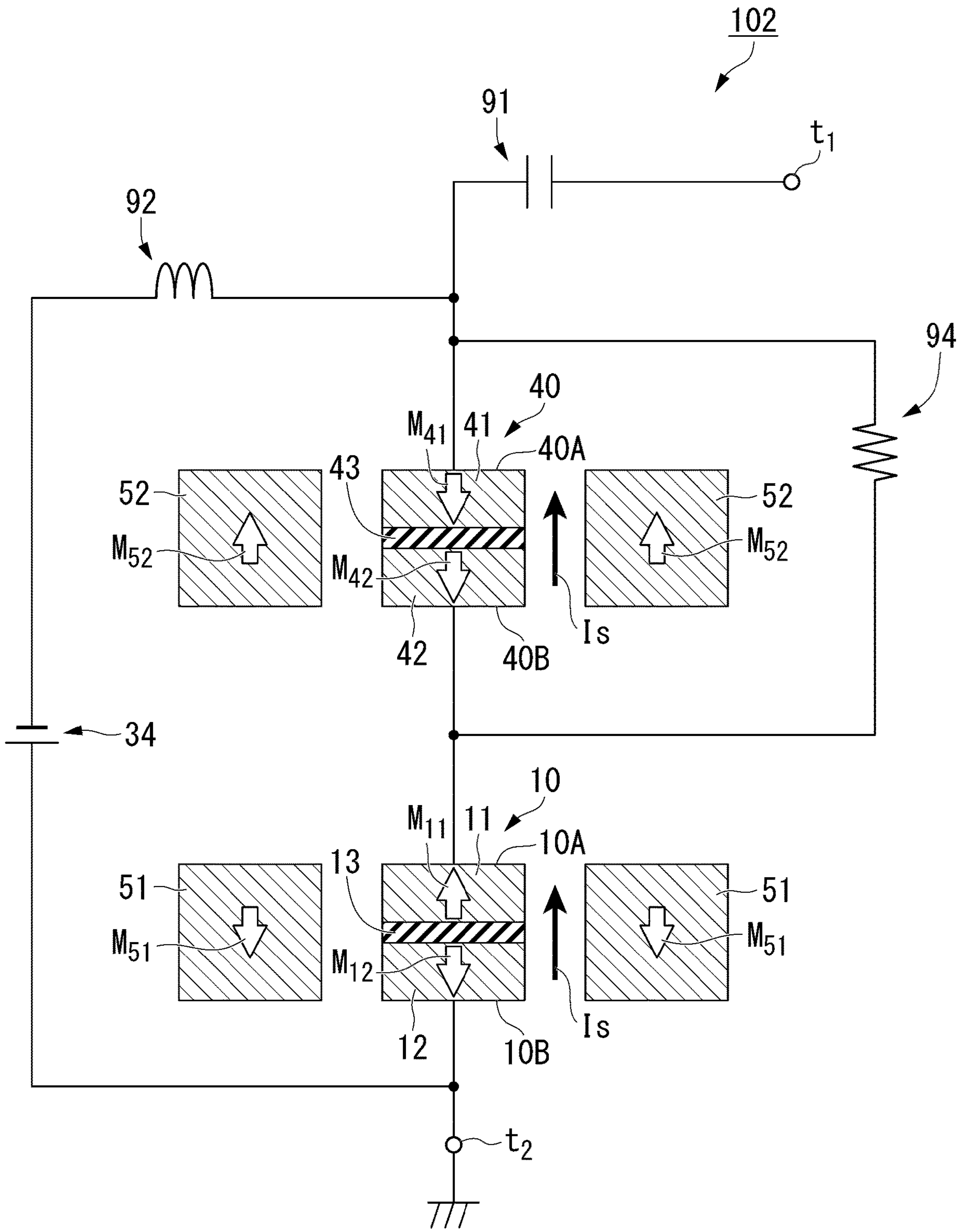
FIG. 18 is a circuit diagram of an optical detection device according to a third embodiment.

FIG. 18 is a circuit diagram of the optical detection device 102 according to a third embodiment. In the third embodiment, the same configurations as those in the second embodiment are denoted by the same reference signs, and description thereof will be omitted. In FIG. 18, a direction of magnetization of the ferromagnetic material in an initial state where the optical detection device 102 is not irradiated with light is indicated by arrows.

The optical detection device 102 includes, for example, the first magnetic element 10, the second magnetic element 40, the capacitor 91, the inductor 92, a resistor 94, the output terminal $t_1$, the reference potential terminal $t_2$, the magnetic field application unit 51, and the magnetic field application unit 52. The optical detection device 102 may include a power supply 34, and the power supply 34 may be external to the optical detection device 102.

The power supply 34 is a DC power supply, and is connected to the first magnetic element 10 and the second magnetic element 40. The power supply 34 applies a DC current or DC voltage to the first magnetic element 10 and the second magnetic element 40. In the optical detection device 102 according to the third embodiment, a power supply that applies a DC current or DC voltage to the first magnetic element 10 and a power supply that applies a DC current or DC voltage to the second magnetic element 40 are shared. The power supply 34 can be the same as the power supply 31.

The optical detection device 102 is configured such that the first surface 10A of the first magnetic element 10 on the output terminal $t_1$ side is connected to a negative terminal of the power supply 34, and a second surface 10B facing the first surface 10A of the first magnetic element 10 is connected to a positive terminal of the power supply 34. The optical detection device 102 is configured such that the first surface 40A of the second magnetic element 40 on the output terminal $t_1$ side is connected to the negative terminal of the power supply 34, and the second surface 40B facing the first surface 40A of the second magnetic element 40 is connected to the positive terminal of the power supply 34.

The optical detection device 102 is configured such that a polarity (sign) of the power supply 34 connected to the first surface 10A of the first magnetic element 10 on the output terminal $t_1$ side is the same as a polarity (sign) as the power supply 34 connected to the first surface 40A on the output terminal $t_1$ side of the second magnetic element 40.

The optical detection device 102 combines the first signal with the second signal according to a predetermined signal processing method and outputs a combination signal from the output terminal $t_1$. The optical detection device 102 combines the first signal with the second signal in the state where the first condition and the second condition are satisfied when the first magnetic element 10 and the second magnetic element 40 are irradiated with the same light pulse.

In the optical detection device 102, since a part of the current supplied from the power supply 34 flows through the resistor 94 connected in parallel to the second magnetic element 40, a magnitude of the sense current Is flowing through the first magnetic element 10 is different from a magnitude of the sense current Is flowing through the second magnetic element 40. This makes it possible to make the absolute value of the amount of change until the first signal reaches the peak different from the absolute value of the amount of change until the second signal reaches the peak, and the first condition is satisfied in the optical detection device 102.

Further, the second condition can be satisfied when the relationship between the magnetization directions of the first ferromagnetic layer 11 and the second ferromagnetic layer 12 of the first magnetic element 10 is different from the relationship between the magnetization directions of the first ferromagnetic layer 41 and the second ferromagnetic layer 42 of the second magnetic element 40 in the state where the first magnetic element 10 and the second magnetic element 40 are not irradiated with light.

In the optical detection device 102 according to the third embodiment, since the absolute value of the amount of change until the first signal reaches the peak is different from the absolute value of the amount of change until the second signal reaches the peak, and the absolute value of the amount of change until the first signal reaches the peak and the absolute value of the amount of change until the second signal reaches the peak have opposite signs, the amounts of change are combined so that the falling time of the output after pulsed light irradiation is short.

Although an example of the third embodiment has been illustrated so far, the optical detection device 102 according to the third embodiment is not limited to this example.

Figure 19:
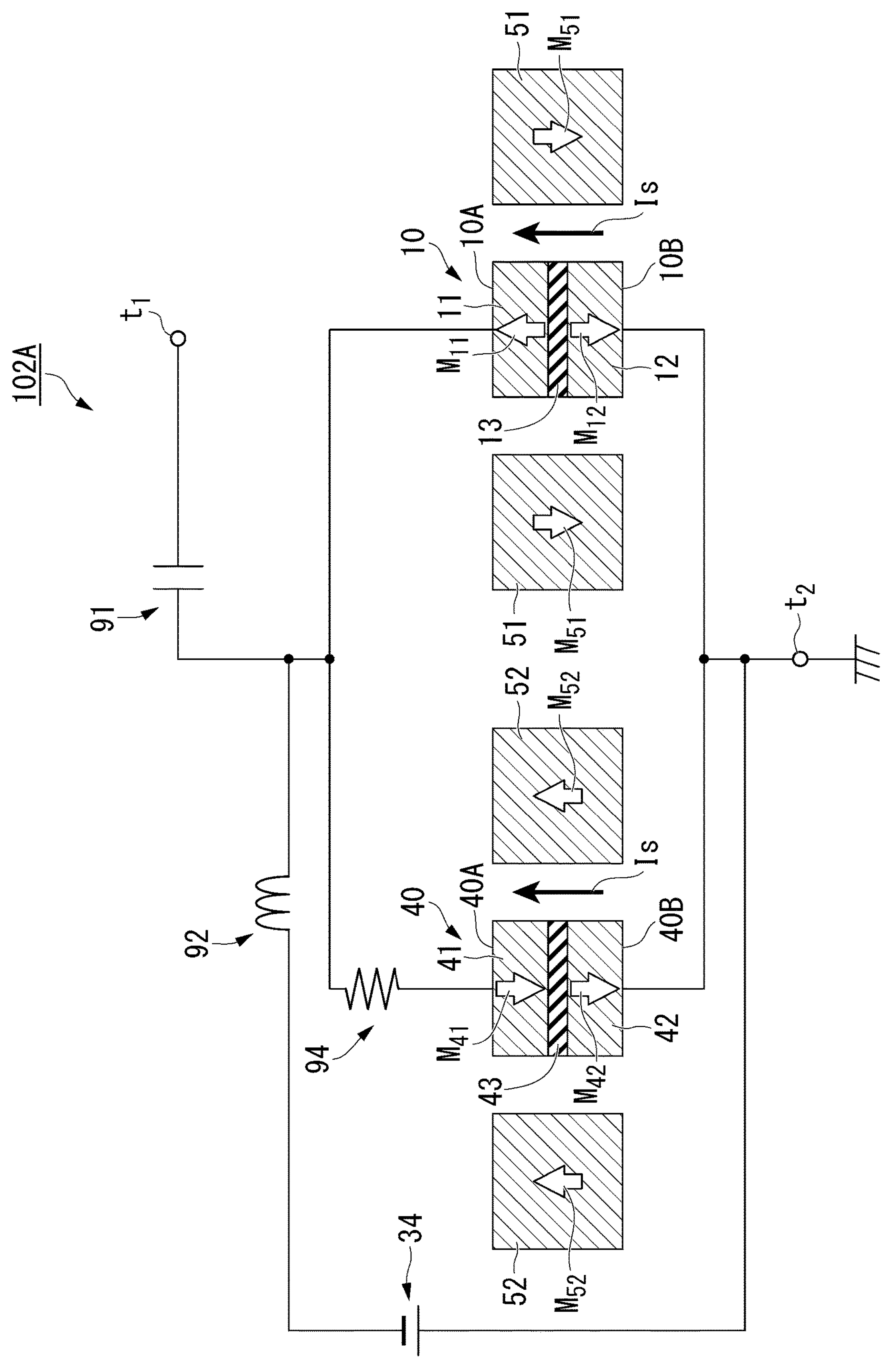
FIG. 19 is a circuit diagram of a first modification example of the optical detection device according to the third embodiment.

For example, FIG. 19 is a circuit diagram of a first modification example of the optical detection device according to the third embodiment. The optical detection device 102A is different from the optical detection device 102 in the connection relationship between the first magnetic element 10 and the second magnetic element 40. In the optical detection device 102A, the first magnetic element 10 and the second magnetic element 40 are connected in parallel between the output terminal $t_1$ and the reference potential terminal $t_2$. In this example, it is possible to make the magnitude of the sense current Is flowing through the first magnetic element 10 different from the magnitude of the sense current Is flowing through the second magnetic element 40 by adjusting a resistance value of the resistor 94, and it is possible to satisfy the first condition.

Since the optical detection device 102A combines the first signal with the second signal in the state where the first condition and the second condition are satisfied, the same effect as the optical detection device 102 according to the third embodiment is achieved.

Further, the magnetization $M_{11}$ of the first ferromagnetic layer 11 and the magnetization $M_{12}$ of the second ferromagnetic layer 12 are in an antiparallel relationship in the state where the first magnetic element 10 and the second magnetic element 40 are not irradiated with light, and the magnetization $M_{41}$ of the first ferromagnetic layer 41 and the magnetization $M_{42}$ of the second ferromagnetic layer 42 are in a parallel relationship, but in this case, even when the magnitudes of the sense currents Is flowing through the first magnetic element 10 and the second magnetic element 40 are the same, the absolute value of the amount of change until the first output reaches the peak tends to be greater than the absolute value of the amount of change until the second output reaches the peak. When difference in the absolute value of the amount of change is sufficient, the connection of the resistor 94 in parallel to the second magnetic element 40 may be omitted in the optical detection device 102 so that the magnitudes of the sense currents Is flowing through the first magnetic element 10 and the second magnetic element 40 are the same.

Fourth Embodiment

Figure 20:
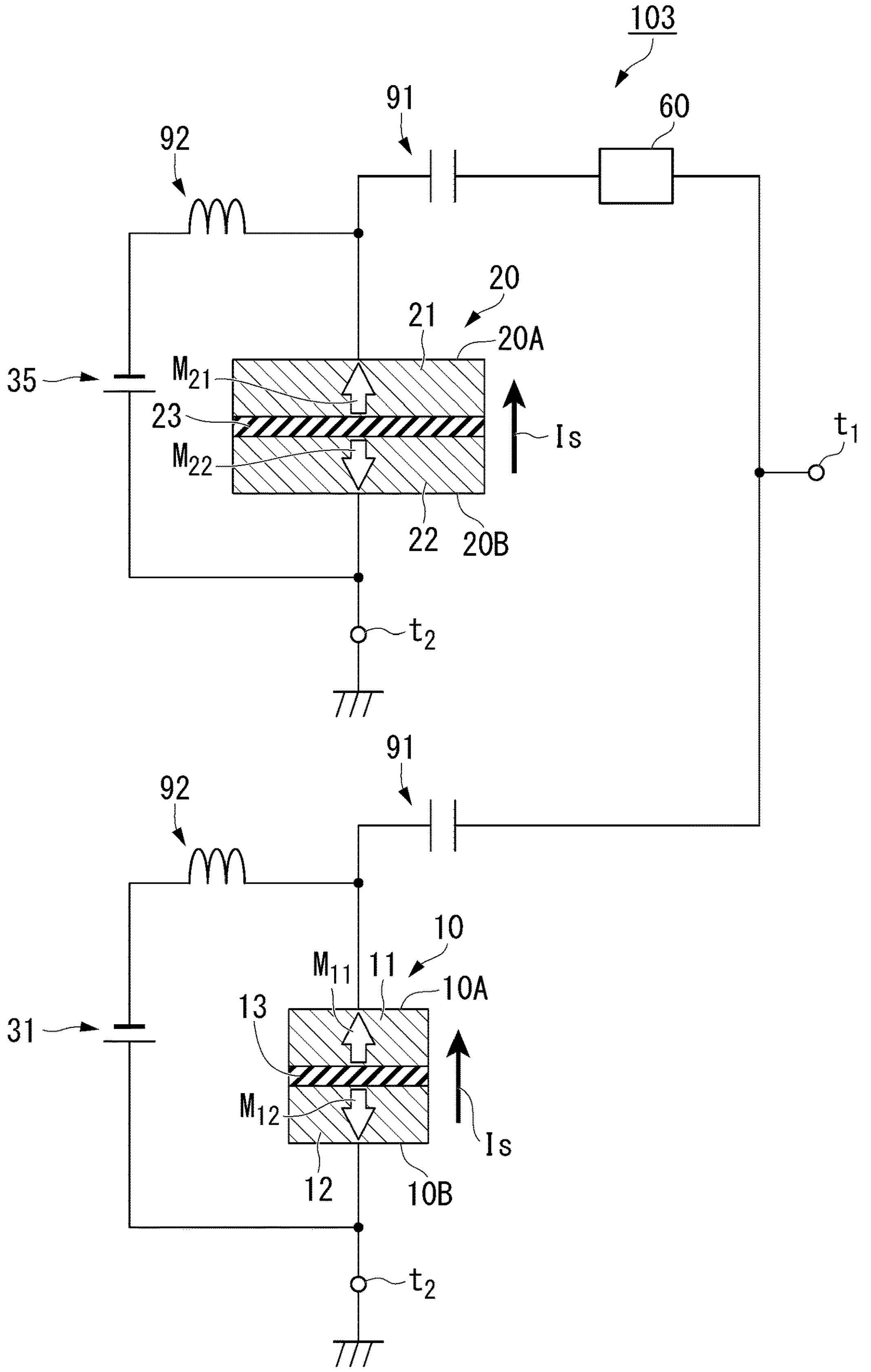
FIG. 20 is a circuit diagram of an optical detection device according to a fourth embodiment.

FIG. 20 is a circuit diagram of the optical detection device 103 according to a fourth embodiment. In the fourth embodiment, the same configurations as those in the first embodiment are denoted by the same reference signs, and description thereof will be omitted. In FIG. 20, directions of magnetization of a ferromagnetic material in a state where the optical detection device 103 is not irradiated with light are indicated by arrows.

The optical detection device 103 includes, for example, the first magnetic element 10, the second magnetic element 20, the capacitor 91, the inductor 92, the output terminal $t_1$, the reference potential terminal $t_2$, and an inversion circuit 60. The optical detection device 103 may include a power supply 31 and a power supply 35, and the power supply 31 and the power supply 35 may be external to the optical detection device 103. The inversion circuit 60 is, for example, between the second magnetic element 20 and the output terminal $t_1$. The inversion circuit 60 may be between the first magnetic element 10 and the output terminal $t_1$. The inversion circuit 60 inverts a polarity of an input signal input to the inversion circuit 60 and outputs the resultant signal. The inversion circuit 60 is, for example, an inversion amplifier circuit (for example, an operational amplifier).

The power supply 35 is a DC power supply and is connected to the second magnetic element 20. As the power supply 35, the same power supply as the power supply 31 can be used. The power supply 35 applies a DC current or DC voltage to the second magnetic element 20. The optical detection device 103 is configured, for example, such that the first surface 20A of the second magnetic element 20 on the output terminal $t_1$ side is connected to a negative terminal of the power supply 35, and the second surface 20B facing the first surface 20A of the second magnetic element 20 is connected to a positive terminal of the power supply 35.

The optical detection device 103 is configured such that a polarity (sign) of the power supply 31 connected to the first surface 10A of the first magnetic element 10 on the output terminal $t_1$ side is the same as a polarity (sign) of the power supply 35 connected to the first surface 20A of the second magnetic element 20 on the output terminal $t_1$ side. Here, although the example in which the first surface 10A is connected to the negative terminal of the power supply 31, the second surface 10B is connected to the positive terminal of the power supply 31, the first surface 20A is connected to the negative terminal of the power supply 35, and the second surface 20B is connected to the positive terminal of the power supply 35 has been shown, the first surface 10A may be connected to the positive terminal of the power supply 31, the second surface 10B may be connected to the negative terminal of the power supply 31, the first surface 20A may be connected to the positive terminal of the power supply 35, and the second surface 20B may be connected to the negative terminal of the power supply 35.

When the first magnetic element 10 is irradiated with a light pulse, the first magnetic element 10 outputs the first output, and change in a voltage of the first output with the output voltage from the first magnetic element 10 in the initial state as a reference is output as the first signal from the output terminal $t_1$. The first signal is a signal caused by the first output. When the second magnetic element 20 is irradiated with a light pulse, the second magnetic element 20 outputs the second output, change in the voltage of the second output with the output voltage from the second magnetic element 40 in the initial state as a reference is extracted by the capacitor 91, and a signal obtained by the inversion circuit 60 inverting a polarity of the signal obtained by extracting the change in the voltage of the second output is output from the output terminal $t_1$ as the second signal. The second signal is a signal caused by the second output.

The optical detection device 103 combines the first signal with the second signal according to a predetermined signal processing method and outputs a combination signal from the output terminal $t_1$. The optical detection device 103 combines the first signal with the second signal when the first magnetic element 10 and the second magnetic element 20 are irradiated with the same light pulse in a state where the first condition and the second condition are satisfied. Although a line between the first magnetic element 10 and the output terminal $t_1$ is simply connected to a line between the second magnetic element 20 and the output terminal $t_1$ in the example illustrated in FIG. 20, the lines are connected using an appropriate power combiner when lengths of the lines are long, thereby curbing occurrence of problems such as signal reflection.

The first condition can be satisfied, for example, by adjusting the values of the currents supplied by the power supply 31 and the power supply 35. It is possible to make the absolute value of the amount of change until the first signal reaches the peak different from the absolute value of the amount of change until the second signal reaches the peak, by adjusting the values of the currents supplied by the power supply 31 and the power supply 35.

Further, the second condition can be satisfied by inverting the polarity of the signal caused by the second output from the second magnetic element 40 using the inversion circuit 60. In this case, the second signal is obtained by inverting a polarity of the signal obtained by extracting the change in the voltage of the second output.

The first signal caused by the first output from the first magnetic element 10 and the second signal caused by the second output from the second magnetic element 20 satisfy the first condition and the second condition at the output terminal $t_1$. Therefore, since the optical detection device 103 combines the first signal with the second signal in the state where the first condition and the second condition are satisfied, the same effects as the optical detection device 100 according to the first embodiment is achieved.

Fifth Embodiment

Figure 21:
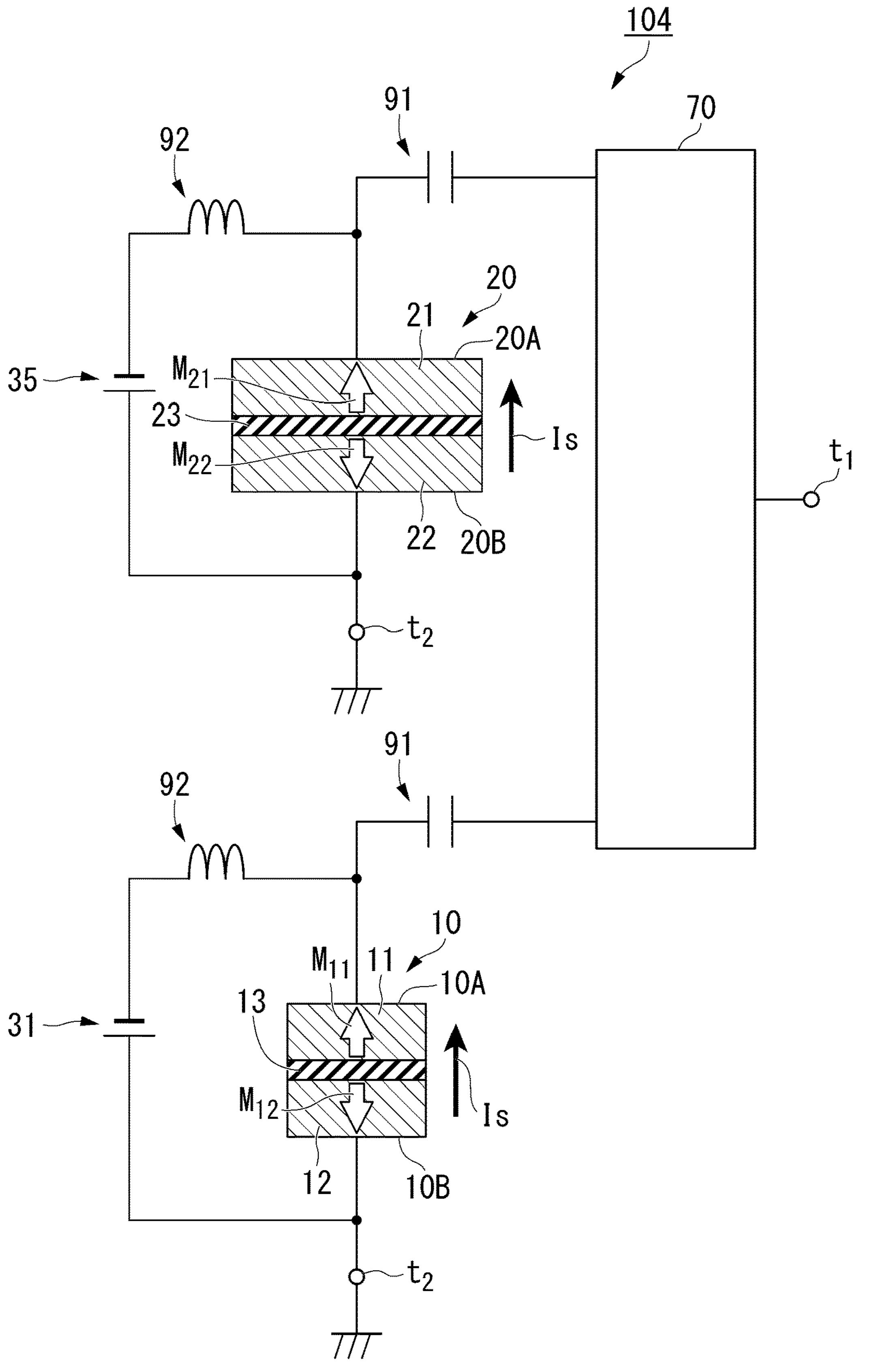
FIG. 21 is a circuit diagram of an optical detection device according to a fifth embodiment.

FIG. 21 is a circuit diagram of the optical detection device 104 according to a fifth embodiment. In the fifth embodiment, the same configurations as those in the fourth embodiment are denoted by the same reference signs, and description thereof will be omitted. In FIG. 21, directions of magnetization of a ferromagnetic material in a state where the optical detection device 104 is not irradiated with light are indicated by arrows.

The optical detection device 104 includes, for example, the first magnetic element 10, the second magnetic element 20, the capacitor 91, the inductor 92, the output terminal $t_1$, the reference potential terminal $t_2$, and a combination unit 70. The optical detection device 104 may include a power supply 31 and a power supply 35, and the power supply 31 and the power supply 35 may be external to the optical detection device 104.

The combination unit 70 is located between the first magnetic element 10 and the output terminal $t_1$ and between the second magnetic element 20 and the output terminal $t_1$. The combination unit 70 combines the first signal caused by the first output from the first magnetic element 10 with the second signal caused by the second output from the second magnetic element 20. The combination unit 70 performs processing for combining the first signal with the second signal in the state where the first condition and the second condition are satisfied. The combination unit 70 performs, for example, signal processing for changing the intensity and polarity of the signal obtained by extracting the change in the voltage of the first output using the capacitor 91 to obtain the first signal, and combines the first signal with a signal (second signal) obtained by extracting the change in voltage of the second output using the capacitor 91, so that the first condition and the second condition are satisfied. The signal processing performed by the combination unit 70 is not limited to this example as long as the signal processing is processing capable of combining the first signal with the second signal in the state where the first condition and the second condition are satisfied. The combination unit 70 may be, for example, a central processing unit (CPU) or a combination circuit.

The first signal caused by the first output from the first magnetic element 10 and the second signal caused by the second output from the second magnetic element 20 are combined in the combination unit 70 in the state where the first condition and the second condition are satisfied. Therefore, the optical detection device 104 has the same effects as the optical detection device 100 according to the first embodiment.

The present invention is not limited to the embodiments and modification examples, and various modifications and changes can be made within the scope of the gist of the present invention described within the claims. For example, characteristic configurations of the embodiments and modification examples may be combined.

For example, in the second embodiment and the third embodiment, an area of the first ferromagnetic layer 11 of the first magnetic element viewed from the z direction may be different from an area of the first ferromagnetic layer 11 of the second magnetic element viewed from the z direction. Similarly, in the second embodiment and the third embodiment, the configurations of the first to third modification examples of the first embodiment may be adopted.

Further, for example, in the third embodiment, the configurations of the first modification example and the second modification example of the second embodiment may be adopted.

Further, for example, although the example in which the capacitor 91 is used to extract the change in voltage of the first output and the second output has been shown in the first to fifth embodiments described above, the first output itself may be combined with the second output itself without the capacitor 91.

The optical detection device according to the embodiments and modification examples can be applied to a transceiver of a communication system, and the like.

Figure 22:
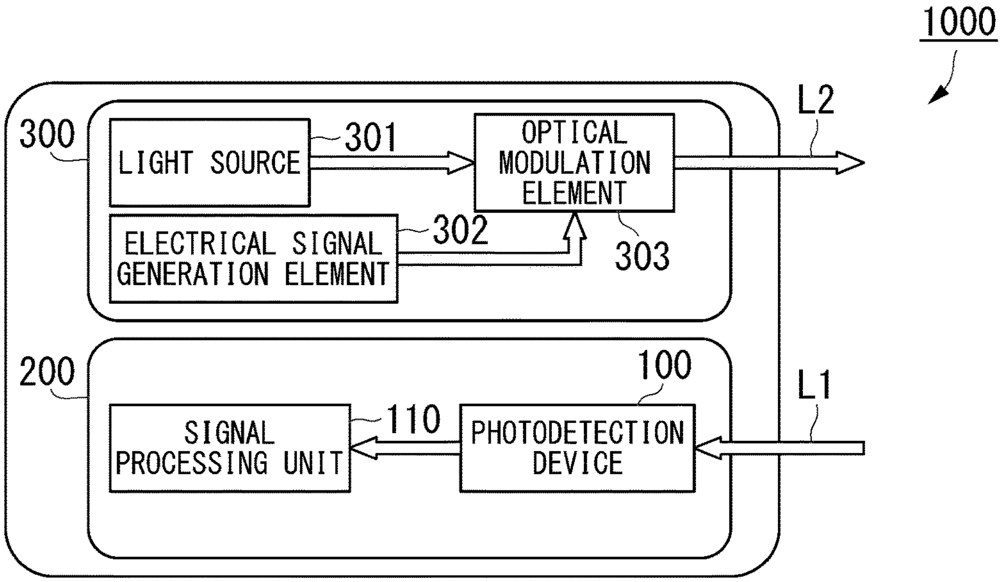
FIG. 22 is a block diagram of a transceiver according to a first application example.
Figure 23:
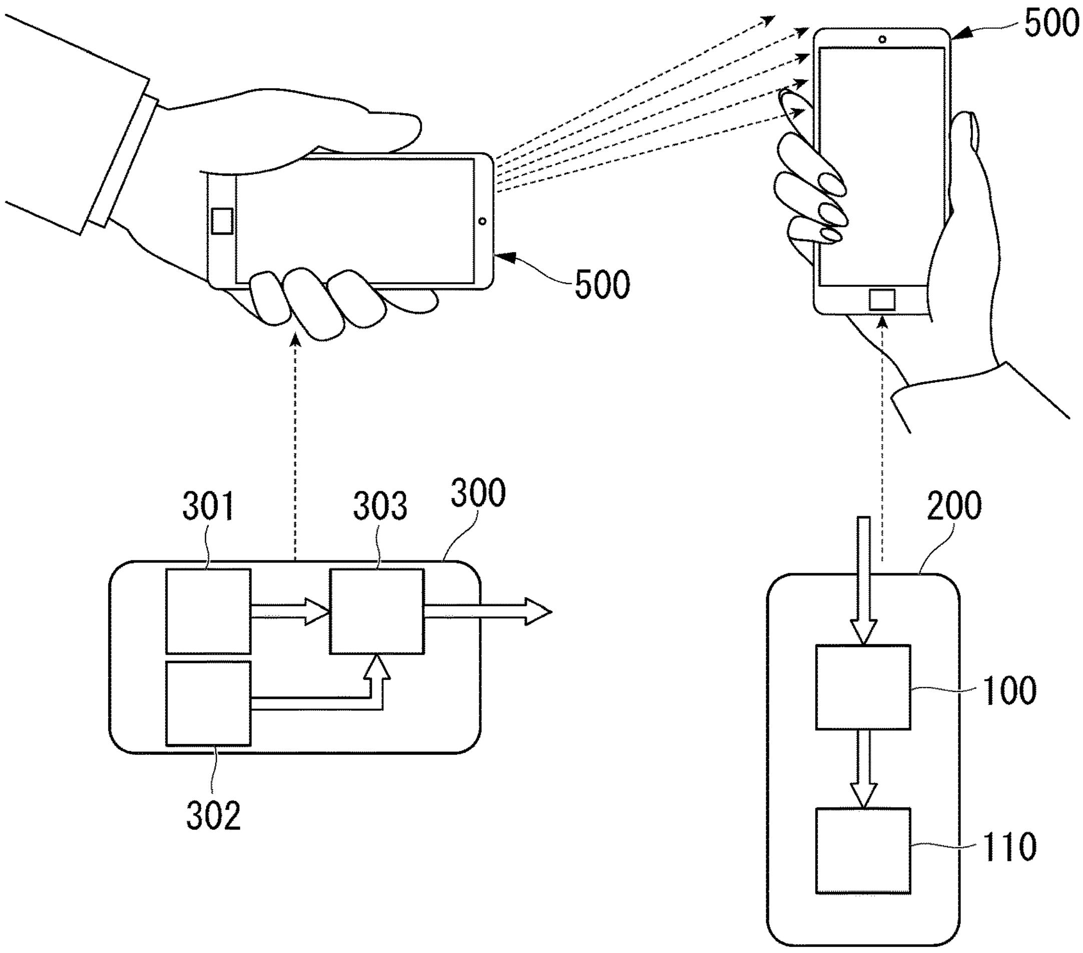
FIG. 23 is a conceptual diagram of an example of a communication system.

FIG. 22 is a block diagram of a transceiver 1000 according to a first application example. The transceiver 1000 includes a receiver 200 and a transmitter 300. The receiver 200 receives an optical signal L1, and the transmitter 300 transmits an optical signal L2.

The receiver 200 includes, for example, the optical detection device 100 and a signal processing unit 110. The optical detection device 100 may be replaced with other embodiments or modification examples described above. In the receiver 200, the first magnetic element 10 and the second magnetic element 20 are irradiated with a plurality of light pulses that are repeated at a high frequency. The optical signal L1 includes the plurality of light pulses. The optical detection device 100 converts the optical signal L1 into an electrical signal. The signal processing unit 110 processes the electrical signal converted by the optical detection device 100. The signal processing unit 110 receives a signal included in the optical signal L1 by processing the electrical signal generated from the optical detection device 100. The receiver 200 receives the signal included in the optical signal L1 on the basis of an output signal from optical detection device 100.

The transmitter 300 includes, for example, a light source 301, an electrical signal generation element 302, and an optical modulation element 303. The light source 301 is, for example, a laser element. The light source 301 may be located outside the transmitter 300. The electrical signal generation element 302 generates an electrical signal based on transmission information. The electrical signal generation element 302 may be made integrally with the signal conversion element of the signal processing unit 110. The optical modulation element 303 modulates light output from the light source 301 on the basis of the electrical signal generated by the electrical signal generation element 302 to output an optical signal L2.

FIG. 22 is a conceptual diagram of an example of a communication system. The communication system illustrated in FIG. 22 includes two terminal devices 500. The terminal device 500 is, for example, a smartphone, a tablet, or a personal computer.

Each of the terminal devices 500 includes the receiver 200 and the transmitter 300. An optical signal transmitted from the transmitter 300 of one of the terminal devices 500 is received by the receiver 200 of the other terminal device 500. Light used for transmission and reception between the terminal devices 500 is, for example, visible light. The receiver 200 includes the optical detection device 100. Since the optical detection device 100 described above has a short signal falling time, it is possible to curb output saturation even when high-speed communication is performed.

EXPLANATION OF REFERENCES

10 First magnetic element
10A, 20A First surface
10B, 20B Second surface
11, 21, 41 First ferromagnetic layer
12, 22, 42 Second ferromagnetic layer
13, 23, 43 Spacer layer
14, 24, 44 First electrode
15, 25, 45 Second electrode
20, 40 Second magnetic element
31, 32, 33, 34, 35 Power supply
51, 52, 53 Magnetic field application unit
60 Inversion circuit
70 Combination unit
91 Capacitor
92 Inductor
93 Insulating layer
94 Resistor
95 Intermediate layer
100, 101, 101A, 101B, 102, 102A, 102B, 103, 104 Optical detection device
110 Signal processing unit
200 Receiver
300 Transmitter
301 Light source
302 Electric signal generation element
303 Optical modulation element
500 Terminal device
1000 Transceiver

What is claimed is:

1. An optical detection device comprising:
a first photoelectric conversion element configured to output a first output when the first photoelectric conversion element is irradiated with a light pulse; and
a second photoelectric conversion element configured to output a second output when the second photoelectric conversion element is irradiated with the light pulse, wherein
the optical detection device is configured to combine a first signal caused by the first output with a second signal caused by the second output when the first photoelectric conversion element and the second photoelectric conversion element are irradiated with the same light pulse, in a state where a first condition and a second condition are satisfied,
the first condition is a condition that an absolute value of an amount of change until the first signal reaches a peak is different from an absolute value of an amount of change until the second signal reaches a peak, and
the second condition is a condition that a sign of the amount of change until the first signal reaches the peak is different from a sign of the amount of change until the second signal reaches the peak.

2. The optical detection device according to claim 1, wherein
the first photoelectric conversion element is a first magnetic element,
the second photoelectric conversion element is a second magnetic element, and
each of the first magnetic element and the second magnetic element includes a first ferromagnetic layer irradiated with the light pulse, a second ferromagnetic layer, and a spacer layer sandwiched between the first ferromagnetic layer and the second ferromagnetic layer.

3. The optical detection device according to claim 2, wherein an area of the first ferromagnetic layer of the first magnetic element viewed from a lamination direction of the first magnetic element is different from that of the first ferromagnetic layer of the second magnetic element viewed from a lamination direction of the second magnetic element.

4. The optical detection device according to claim 2, wherein a thickness of the first ferromagnetic layer of the first magnetic element is different from that of the first ferromagnetic layer of the second magnetic element.

5. The optical detection device according to claim 2, wherein magnetic anisotropy of the first ferromagnetic layer of the first magnetic element is different from that of the first ferromagnetic layer of the second magnetic element.

6. The optical detection device according to claim 2, wherein, in a state where the first magnetic element and the second magnetic element are not irradiated with the light pulse, a relationship between magnetization directions of the first ferromagnetic layer and the second ferromagnetic layer of the first magnetic element is different from a relationship between magnetization directions of the first ferromagnetic layer and the second ferromagnetic layer of the second magnetic element.

7. The optical detection device according to claim 2, wherein a polarity of a DC power supply connected to a surface on the output terminal side of the first magnetic element is different from a polarity of a DC power supply connected to a surface on the output terminal side of the second magnetic element.

8. The optical detection device according to claim 6, wherein a polarity of a DC power supply connected to a surface on the output terminal side of the first magnetic element is the same as a polarity of a DC power supply connected to a surface on the output terminal side of the second magnetic element.

9. The optical detection device according to claim 1, further comprising:

a combination unit connected to the first photoelectric conversion element and the second photoelectric conversion element, wherein the combination unit combines the first signal with the second signal in a state where the first condition and the second condition are satisfied.

10. The optical detection device according to claim 1, further comprising:

an inversion circuit, wherein the inversion circuit inverts a polarity of a signal caused by the second output to generate the second signal.

11. The optical detection device according to claim 2, further comprising:

a highly thermally conductive layer, wherein the highly thermally conductive layer is located outside the first magnetic element when viewed from a lamination direction of the first magnetic element, and a thermal conductivity of the highly thermally conductive layer is higher than that of an electrode that is in contact with the first ferromagnetic layer of the first magnetic element.

12. A signal processing method comprising:

combining a first signal caused by a first output from a first photoelectric conversion element with a second signal caused by a second output from a second photoelectric conversion element when the first photoelectric conversion element and the second photoelectric conversion element are irradiated with the same light pulse, in a state where a first condition and a second condition are satisfied, wherein the first condition is a condition that an absolute value of an amount of change until the first signal reaches a peak is different from an absolute value of an amount of change until the second signal reaches a peak, and the second condition is a condition that a sign of the amount of change until the first signal reaches the peak is different from a sign of the amount of change until the second signal reaches the peak.

* * * * *